(12) United States Patent
Takahashi et al.

(10) Patent No.: US 12,023,892 B2
(45) Date of Patent: Jul. 2, 2024

(54) STRUCTURE BODY, STRUCTURE BODY MANUFACTURING METHOD, AND ELECTRONIC APPARATUS

(71) Applicants: SONY GROUP CORPORATION, Tokyo (JP); TOHOKU UNIVERSITY, Miyagi (JP)

(72) Inventors: Yuichi Takahashi, Tokyo (JP); Shohei Abe, Tokyo (JP); Gen Yonezawa, Tokyo (JP); Takehito Shimatsu, Miyagi (JP); Miyuki Uomoto, Miyagi (JP)

(73) Assignees: Sony Group Corporation, Tokyo (JP); Tohoku University, Miyagi (JP)

( * ) Notice: Subject to any disclaimer, the term of this patent is extended or adjusted under 35 U.S.C. 154(b) by 347 days.

(21) Appl. No.: 17/413,658

(22) PCT Filed: Dec. 6, 2019

(86) PCT No.: PCT/JP2019/047879
§ 371 (c)(1),
(2) Date: Jun. 14, 2021

(87) PCT Pub. No.: WO2020/144992
PCT Pub. Date: Jul. 16, 2020

(65) Prior Publication Data
US 2022/0055343 A1  Feb. 24, 2022

(30) Foreign Application Priority Data
Jan. 7, 2019 (JP) .................. 2019-000662

(51) Int. Cl.
*B32B 15/04* (2006.01)
*C03C 27/04* (2006.01)
(Continued)

(52) U.S. Cl.
CPC .............. *B32B 15/04* (2013.01); *C03C 27/04* (2013.01); *C04B 37/023* (2013.01);
(Continued)

(58) Field of Classification Search
CPC ..... C03C 27/04; C03C 27/042; C03C 27/044; C03C 27/046; C04B 37/023; C04B 37/026; H01L 31/00; H01L 31/024
See application file for complete search history.

(56) References Cited

U.S. PATENT DOCUMENTS

2013/0302622 A1  11/2013  Woo
2017/0276280 A1*  9/2017  Kobayashi ............. F16L 41/02

FOREIGN PATENT DOCUMENTS

GB  2495378 A  4/2013
JP  2004337927 A  12/2004
(Continued)

OTHER PUBLICATIONS

International Search Report prepared by the Japan Patent Office dated Feb. 19, 2020, for International Application No. PCT/JP2019/047879.

*Primary Examiner* — Zachary M Davis
(74) *Attorney, Agent, or Firm* — Sheridan Ross PC

(57) ABSTRACT

A structure body according to an embodiment of the present disclosure includes: a first base having one surface, and having a density lower than a density that is determined by a crystal structure and a composition of a constituent material; a second base disposed to face the one surface of the first base; and a buffer layer provided between the first base and the second base, and containing at least a metal element.

20 Claims, 18 Drawing Sheets

(51) Int. Cl.
*C04B 37/02* (2006.01)
*H01L 33/50* (2010.01)
*F21S 41/176* (2018.01)
*G03B 21/20* (2006.01)
*H01L 33/58* (2010.01)

(52) U.S. Cl.
CPC ........ *H01L 33/507* (2013.01); *C04B 2237/32* (2013.01); *C04B 2237/40* (2013.01); *C04B 2237/52* (2013.01); *F21S 41/176* (2018.01); *G03B 21/204* (2013.01); *H01L 33/501* (2013.01); *H01L 33/58* (2013.01)

(56) References Cited

FOREIGN PATENT DOCUMENTS

| | | |
|---|---|---|
| JP | 2010-046696 | 3/2010 |
| JP | 2013-243360 | 12/2013 |
| JP | 7002398 B2 | 1/2022 |
| WO | WO 2018/216763 | 11/2018 |

\* cited by examiner

# STRUCTURE BODY, STRUCTURE BODY MANUFACTURING METHOD, AND ELECTRONIC APPARATUS

CROSS REFERENCE TO RELATED APPLICATIONS

This application is a national stage application under 35 U.S.C. 371 and claims the benefit of PCT Application No. PCT/JP2019/047879 having an international filing date of 6 Dec. 2019, which designated the United States, which PCT application claimed the benefit of Japanese Patent Application No. 2019-000662 filed 7 Jan. 2019, the entire disclosures of each of which are incorporated herein by reference.

TECHNICAL FIELD

The present disclosure relates to, for example, a structure body bonded using an atomic diffusion bonding and a manufacturing method thereof, and an electronic apparatus including the same.

BACKGROUND ART

Unlike an adhesion technique capable of filling a space like an adhesive, for example, in an inorganic bonding including an atomic diffusion bonding disclosed in Patent Literature 1, a bonding surface having a small surface roughness, i.e., a bonding surface having a small arithmetic average roughness (Ra) is desired in order to increase a contact area in a bonding interface and to secure a bonding force. For example, a glass and a crystal body are easy to achieve a bonding surface having the small arithmetic average roughness (Ra) by a polishing process, and thus there are many practical examples in terms of the atomic diffusion bonding, optical contact, and the like.

CITATION LIST

Patent Literature

Patent Literature 1: Japanese Unexamined Patent Application Publication No. 2010-46696

SUMMARY OF THE INVENTION

However, in a porous base material such as ceramics or a base material in which processing and handling are difficult, or a so-called difficult-to-process glass material, it is difficult to secure a bonding surface having a small arithmetic average roughness (Ra) by a polishing process, and it is difficult to obtain a sufficient bonding strength.

It is desirable to provide a structure body and a structure body manufacturing method that make it possible to improve a bonding strength, and an electronic apparatus including the same.

A structure body according to one embodiment of the present disclosure includes: a first base having one surface, and having a density lower than a density that is determined by a crystal structure and a composition of a constituent material; a second base disposed to face the one surface of the first base; and a buffer layer provided between the first base and the second base, and containing at least a metal element.

A structure body manufacturing method according to one embodiment of the present disclosure includes: bonding a first base and a second base, in which the first base has one surface, and has a density lower than a density that is determined by a crystal structure and a composition of a constituent material; and forming, between the first base and the second base, a buffer layer containing at least a metal element.

An electronic apparatus according to one embodiment of the present disclosure includes the structure body according to one embodiment of the present disclosure described above.

In the structure body according to one embodiment, the structure body manufacturing method according to one embodiment, and the electronic apparatus according to one embodiment of the present disclosure, the buffer layer containing at least the metal element that is superior in processability is provided between the first base and the second base. The first base has the one surface, and has the density lower than the density that is determined by the crystal structure and the composition of the constituent material. The second base is disposed to face the one surface of the first base. Hence, a bonding surface having a small arithmetic average roughness (Ra) is formed on the one surface of the first base.

MODES FOR CARRYING OUT THE INVENTION

The following describes embodiments of the present disclosure in detail with reference to the drawings. The following description is a concrete example of the present disclosure, and the present disclosure is not limited to the following embodiments. In addition, the present disclosure is not limited to arrangement, dimensions, dimensional ratios, and the like of the respective constituent elements illustrated in the respective drawings. It is to be noted that the description is given in the following order.

1. First Embodiment (an example of a structure body using a porous base for one side)
    1-1. Configuration of Structure Body
    1-2. Structure Body Manufacturing Method
    1-3. Workings and Effects
2. Second Embodiment (an example of a structure body using a porous base or a metal base for the other side)
3. Modification Examples
    3-1. Modification Example 1 (an example in which a buffer layer has a light permeability)
    3-2. Modification Example 2 (an example of a structure body using a difficult-to-process glass material for one side)
4. Examples

1. First Embodiment

Figure 1:
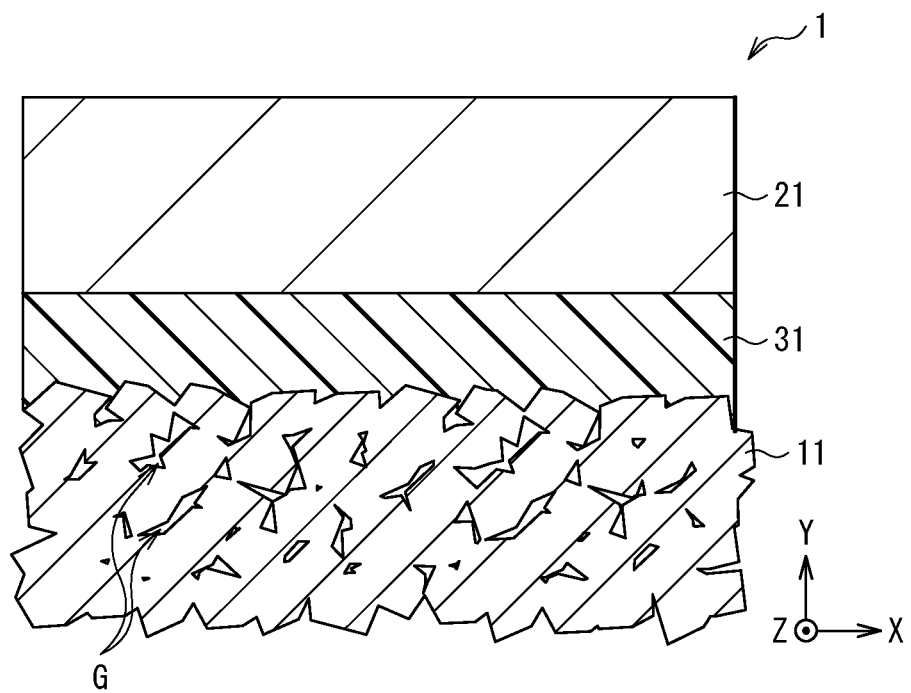
FIG. 1 is a schematic cross-sectional diagram illustrating a configuration of a structure body according to a first embodiment of the present disclosure.

FIG. 1 schematically illustrates a cross-sectional configuration of a structure body (a structure body 1) according to a first embodiment of the present disclosure. The structure body 1 has a laminated structure in which two or more to-be-bonded members are bonded together by, for example, an atomic diffusion bonding, and constitutes, for example, a wavelength conversion device used for a projector or the like (for example, see FIG. 11A). In the structure body 1 of the present embodiment, a porous base 11 (a first base) having a density lower than a density that is determined by a crystal structure and a composition of a constituent material and a base 21 (a second base) disposed to face one surface of the porous base 11 are bonded by, for example, the atomic diffusion bonding in a buffer layer 31 that contains at least a metal element.

1-1. Configuration of Structure Body

The porous base 11, as described above, has the density lower than the density that is determined by the crystal structure and the composition of a material structuring the porous base 11, and has, for example, a plurality of voids G in a layer, so that the density is lower than that of a consecutive crystal body. The porous base 11 is a base material having, in at least a portion thereof, a region having a large arithmetic average roughness (Ra) representing a surface roughness, and involves difficulties in reducing the arithmetic average roughness (Ra) by a polishing process. The porous base 11 of the present embodiment has, for example, the arithmetic average roughness (Ra) of 2 nm or more and the plurality of voids G of, for example, 0.5 μm or more and 3 μm or less. Examples of the porous base 11 include a sintered body such as ceramics and the like.

The base 21 has, for example, a planar surface as a bonding surface, and includes, for example, an inorganic material or a plastic material. Examples of the inorganic material include crystalline solids of inorganic oxides such as silicon oxide ($SiO_x$), aluminum oxide ($AlO_x$), and YAGs (yttrium-aluminum garnet), and vitreous solids (amorphous solids). Note that a vitreous solid configured by the above material includes a spin-on glass (SOG) or the like. In addition, examples include semiconductors such as silicon (Si) or germanium (Ge), silicon nitride ($SiN_x$), silicon carbide (SiC), and diamond. Examples of the plastic material include polycarbonate (PC), polyethylene terephthalate (PET), polyimide (PI), polyethylene naphthalate (PEN) and polyethyl ether ketone (PEEK).

The porous base 11 and the base 21 may have a light permeability or may not have the light permeability. Examples of the base 21 having the light permeability include glasses and quartz substrates.

The buffer layer 31 is a junction that bonds the porous base 11 and the base 21. The buffer layer 31 includes a foundation layer 31A and metal films 32 and 33 formed in manufacturing process steps of the structure body 1 to be described later. The metal film 32 is provided on the porous base 11 via the foundation layer 31A. The metal film 33 is provided, for example, directly on the base 21. In the buffer layer 31, a metal element derived from the metal films 32 and 33 is locally distributed in a film-thickness direction.

The buffer layer 31 includes, for example, an inorganic material (an inorganic oxide) bonded with, for example, oxygen derived from the foundation layer 31A. Specific examples include silicon oxide ($SiO_x$), aluminum oxide ($AlO_x$), niobium oxide ($NbO_x$), titanium oxide ($TiO_x$), tantalum oxide ($Ta_2O_5$), aluminum lanthanum oxide ($AlLaO_x$), titanium lanthanum oxide ($TiLaO_x$), and hafnium oxide ($HfO_x$). The buffer layer 31 further includes aluminum (Al), titanium (Ti), vanadium (V), chromium (Cr), iron (Fe), cobalt (Co), nickel (Ni), copper (Cu), zinc (Zn), gallium (Ga), germanium (Ge), zirconium (Zr), niobium (Nb), molybdenum (Mo), ruthenium (Ru), rhodium (Rh), palladium (Pd), silver (Ag), platinum (Pt), gold (Au), indium (In), tin (Sn), hafnium (Hf), tungsten (W), tantalum (Ta), and the like derived from the metal films 32 and 33. In addition, the buffer layer 31 may include an inorganic nitride such as silicon nitride (SiN), an inorganic oxynitride such as silicon oxynitride (SiON), an inorganic fluoride such as silicon fluoride ($SiF_x$), or the like. A film thickness (hereinafter simply referred to as "thickness") of the buffer layer 31, for example, in a Y-axis direction is preferably 10 nm or greater and 10 μm or less, for example.

Note that the inorganic oxide structuring the buffer layer 31 may be a vitreous solid (amorphous solid) or a crystalline solid.

In the buffer layer 31, the metal element derived from the metal films 32 and 33 is locally distributed in the film-thickness direction, but the metal element interdiffuses at an interface with the foundation layer 31A and the base 21 by a kinetic energy and a thermal energy at the time of forming the buffer layer 31, a heat treatment after the bonding, and the like. In a case where a distribution of the metal element in the buffer layer 31 is measured by, for example, energy dispersive X-ray spectroscopy (Energy Dispersive X-ray analysis: EDX), electron energy loss spectroscopy (Electron Energy Loss Spectroscopy: EELS), secondary ion mass spectroscopy (Secondary Ion Mass Spectrometry: SIMS), TOF-SIMS spectroscopy, or the like, it is possible to confirm the density distribution of the metal element which continuously decreases in a predetermined range from the interface with the base 21 to an interface of the porous base 11 by the interdiffusion of the metal element and the disturbance of bonding interface. Further, for example, in a case where both the porous base 11 and a porous base 41 are provided with foundation layers as in a structure body 2 of a second embodiment to be described later, it is possible to confirm the density distribution of the metal element which continuously decreases in a predetermined range from the inside of a layer of the buffer layer 31 toward the interfaces of the porous base 11 and the base 21. Incidentally, in a case where the interdiffusion of the metal element at an interface with the metal film 32 and the foundation layer 31A and an interface with the metal film 33 and the base 21 is small, in a case where the surface roughness Ra of the foundation layer 31A and the base 21 is small, or the like, the continuous decrease in the metal element becomes steep and may sometimes be observed as a concentration distribution existing rectangularly within a predetermined range.

1-2. Structure Body Manufacturing Method

It is possible to manufacture the structure body 1, for example, as follows.

Figure 2A:
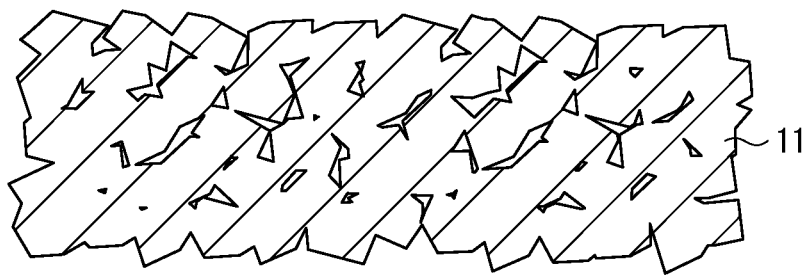
FIG. 2A is a schematic cross-sectional diagram illustrating an example of a method of manufacturing the structure body illustrated in FIG. 1.
Figure 2B:
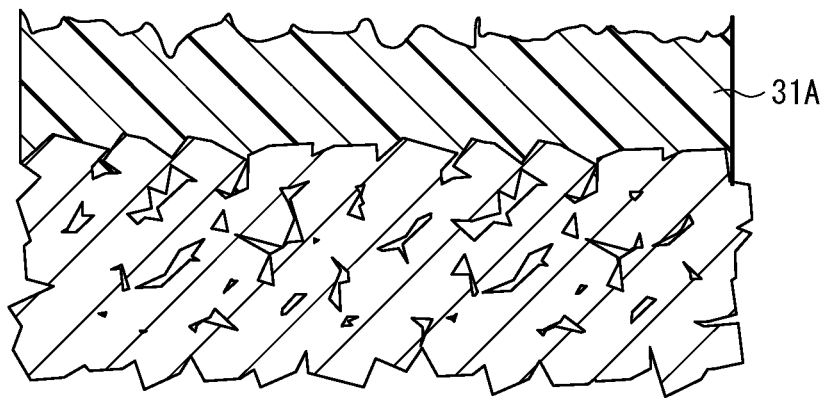
FIG. 2B is a schematic cross-sectional diagram illustrating a process step following FIG. 2A.

First, as illustrated in FIG. 2A, the porous base 11 having a large arithmetic average roughness (Ra) is prepared. Next, as illustrated in, for example, FIG. 2B, the foundation layer 31A is formed on a bonding surface of the porous base 11 by, for example, ion-assisted deposition (Ion Assisted Deposition: IAD) to a thickness of, for example, 10 nm or greater and 10 μm or less by considering a polishing amount and a roughness of a surface of the porous base 11. Note that the foundation layer 31A may be formed using a vacuum deposition method, a sputtering method, an ion plating method, a chemical vapor deposition method (Chemical Vapor Deposition: CVD), and the like, besides the IAD.

The foundation layer 31A includes an inorganic oxide structuring the buffer layer 31 described above. For the foundation layer 31A, it is preferable to use a material having a good polishing processability. Specifically, the foundation layer 31A includes one or two or more of, for example, silicon oxide ($SiO_x$), aluminum oxide ($AlO_x$), niobium oxide ($NbO_x$), titanium oxide ($TiO_x$), tantalum oxide ($Ta_2O_5$), aluminum lanthanum oxide ($AlLaO_x$), titanium lanthanum oxide ($TiLaO_x$) and hafnium oxide ($HfO_x$). A thickness of the foundation layer 31A is preferably formed as a thickness of, for example, 10 nm or greater and 10 μm or less as described above, but is not limited thereto.

Figure 2C:
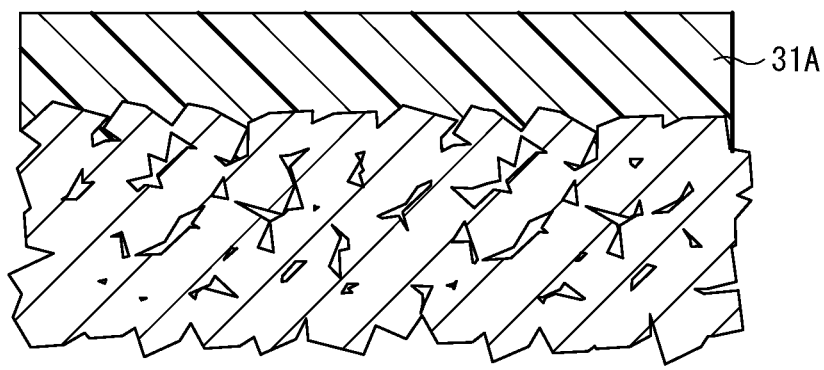
FIG. 2C is a schematic cross-sectional diagram illustrating a process step following FIG. 2B.

Subsequently, as illustrated in FIG. 2C, for example, polishing by physical or chemical action is performed to reduce the arithmetic average roughness (Ra) of the foundation layer 31A. Specifically, a surface of the foundation layer 31A preferably has smoothness, and preferably has the arithmetic average roughness (Ra) of, for example, 0.5 nm or less. Thus, a bonding surface preferable for an atomic diffusion bonding method is obtained.

Note that the arithmetic average roughness (Ra) of the bonding surface to be obtained varies depending on, for example, the thicknesses of the metal films 32 and 33 used for bonding.

For example, in a case where two bases including a glassy material are to be bonded using titanium (Ti) which is a metal structuring a bonding metal layer (the metal films 32 and 33), the arithmetic average roughness (Ra) of the bonding surface to be obtained is as follows. For example, in a case where a thickness of the bonding metal layer (a Ti film) provided on one of the bases is 50 nm or less, it is possible to perform the bonding without pressure if the arithmetic average roughness (Ra) of the bonding surface is 1 nm or less, and 0.3 nm or less is more preferable. Further, in a case where the thickness of the bonding metal layer (the Ti film) provided on one of the bases is thicker than 20 nm, it is possible to perform the bonding by pressurization of 10 MPa or greater if the arithmetic average roughness (Ra) of the bonding surface is 1.0 nm or less.

A relationship between the thickness of the bonding metal layer desirable for the bonding and the arithmetic average roughness (Ra) of the bonding surface (in this embodiment, the foundation layer 31A and the base 21) depends on a crystal structure and a self-diffusion coefficient of the bonding metal layer. For example, in a case where aluminum (Al), gold (Au), or the like having a face-centered cubic lattice and having the large self-diffusion coefficient is used for the bonding metal layer, it is possible to perform the boding even if the arithmetic average roughness (Ra) is large, because an atomic rearrangement phenomenon easily occurs in the bonding interface. Further, in a case where, for example, an aluminum (Al) film is used as the bonding metal layer and one or both of the bases are the metal base as in a structure body 3 of the second embodiment to be described later, it is possible to induce elastic deformation and plastic deformation in the metal base and the bonding metal layer by performing pressurization of 30 MPa or greater at the time of bonding. In such cases, it is possible to perform the bonding even when the surface roughness (Ra) is about 3 nm.

Note that the foundation layer 31A may be formed using a film-formation process having a self-smoothing effect. In this case, the polishing process described above is unnecessary. Further, for the foundation layer 31A, besides the material having a good polishing processability as described above, a method of securing a bonding area by means of a perimeter by forming, on a base, a film of a resin which is easily deformed is also effective. It is further effective to use a highly wettable resin in which a surface roughness of a resin surface is reduced by surface tension.

Figure 2D:
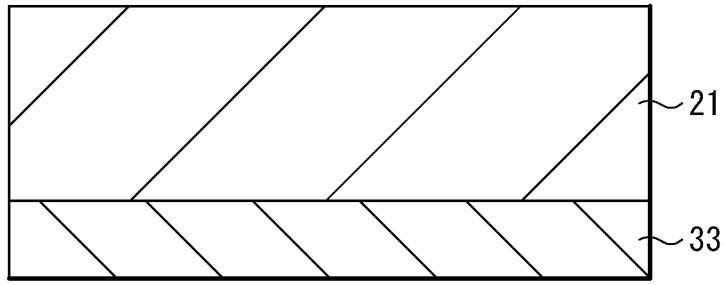
FIG. 2D is a schematic cross-sectional diagram illustrating a process step following FIG. 2C.
Figure 2D:
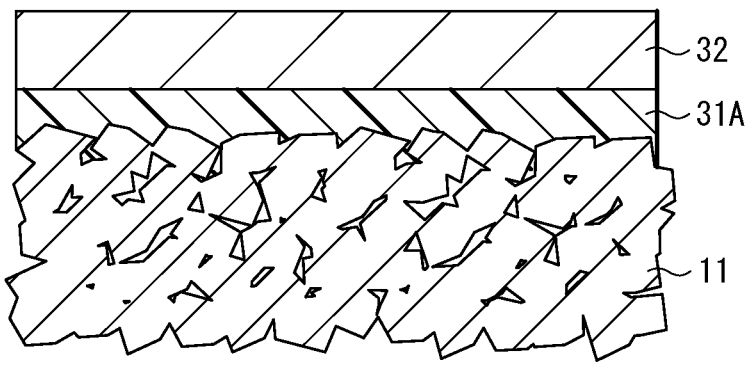

Next, as illustrated in FIG. 2D, the metal film 32 having, for example, a microcrystal structure is formed on the foundation layer 31A, and the base 21 is prepared in which the metal film 33 is formed on a surface using a similar method. Note that the arithmetic average roughness (Ra) desirable for the base 21 and the thickness of the metal film 33 are the same as the arithmetic average roughness (Ra) desirable for the foundation layer 31A and the thickness of the metal film 32. Subsequently, the porous base 11 and the base 21 are disposed face-to-face so that the metal film 32 on the porous base 11 and the metal film 33 on the base 21 face each other.

The metal films 32 and 33 have a microcrystal structure, and includes, for example, aluminum (Al), titanium (Ti), vanadium (V), chromium (Cr), iron (Fe), cobalt (Co), nickel (Ni), gold (Au), platinum (Pt), copper (Cu), zinc (Zn), gallium (Ga), germanium (Ge), zirconium (Zr), niobium (Nb), molybdenum (Mo), ruthenium (Ru), rhodium (Rh), palladium (Pd), silver (Ag), indium (In), tin (Sn), hafnium (Hf), and tantalum (Ta), tungsten (W), and stainless steel. In the present embodiment, as will be described later, the metal film 32 and the metal film 33 are superimposed to bond the porous base 11 and the base 21 using the atomic diffusion bonding method. At this time, if the surfaces of the foundation layer 31A and the base 21 are smooth, it is possible to perform the bonding even when the metal films 32 and 33 are extremely thin films having a thickness of 0.2 nm, for example.

For example, the metal films 32 and 33 are formed using the following methods. First, for example, in a vacuum container where the ultimate vacuum is a high degree of vacuum of $1 \times 10^{-4}$ to $1 \times 10^{-8}$ Pa, for example, a physical vapor deposition (Physical Vapor Deposition: PVD) such as a sputtering method or ion plating, a CVD method, or various deposition methods is used to form a film of, for example, a Ti film having a thickness of 0.2 nm or greater and 200 nm or less. Note that in a case where a metal material having a relatively low diffusing speed is to be used, it is preferable to form the film by a vacuum-deposition method or a sputtering method in which the film formation is performed with the plasma capable of increasing the inner stresses of the formed metal films 32 and 33 being generated.

A pressure in the vacuum chamber at the time of the film formation of the metal films 32 and 33 may be a vacuum atmosphere having the ultimate vacuum of $1 \times 10^{-4}$ to $1 \times 10^{-8}$ Pa, but a lower pressure (a higher vacuum degree) is preferable. Thus, for example, it becomes possible to use a material which is easily oxidized, such as Al.

In a case where the metal film 32 is to be formed using the sputtering method, it is preferable that a pressure of an inert gas (generally, an argon (Ar) gas) at the time of film formation be in a dischargeable region (e.g., 0.01 Pa or greater). However, because there is a possibility that the bonding exceeding 30 Pa (300 μbar) is not performable, an upper limit is preferably set to 30 Pa (300 μbar) or less. This is because the arithmetic average roughness Ra of the metal film 32 to be formed increases as the Ar-gas pressure rises. Note that the metal films 32 and 33 may be formed using a film-formation process having a self-smoothing effect. In such a case, the surfaces of the metal films 32 and 33 become smooth, allowing for the bonding even when the arithmetic average roughness (Ra) of the bonding surface is large.

Note that the film formation of the metal films 32 and 33 and the bonding of the metal film 32 and the metal film 33 to be described later are desirably performed in the same device under a vacuum condition. Thus, oxidation of the surfaces of the metal films 32 and 33 is reduced, making it possible to perform the good bonding.

Figure 2E:
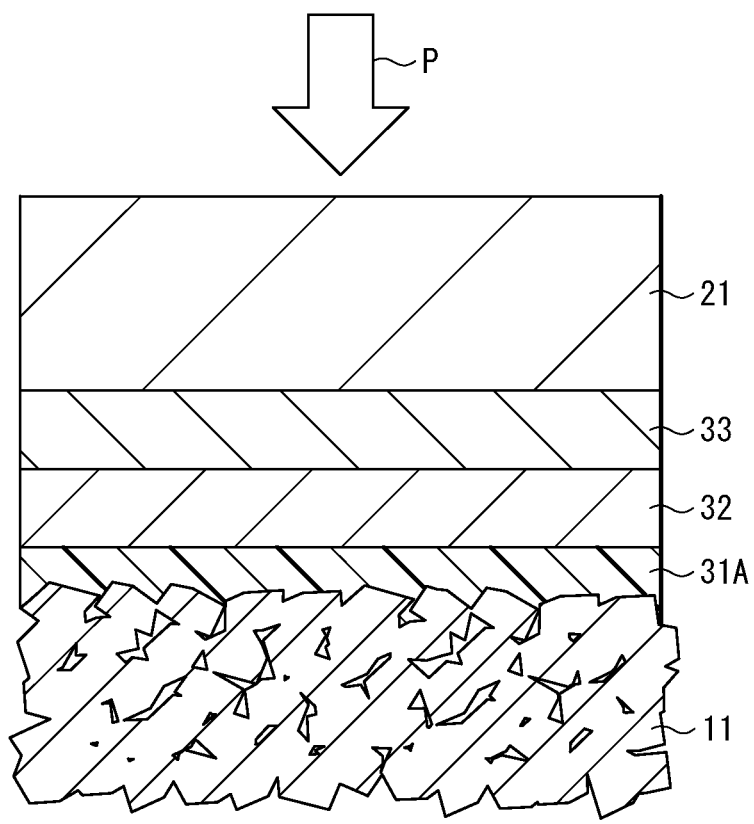
FIG. 2E is a schematic cross-sectional diagram illustrating a process step following FIG. 2D.

Subsequently, as illustrated in FIG. 2E, the porous base 11 and the base 21 are bonded, for example, by using the atomic diffusion bonding method, through superimposing the metal film 32 and the metal film 33 on each other and applying a pressure (P) from the base 21 side, for example. This makes it possible to cause atomic diffusion at the bonding interface and grain boundaries between the metal film 32 and the metal film 33 and to perform the bonding in which the bonding strain is relaxed. Thus, the structure body 1 illustrated in FIG. 1 is completed.

Note that the bonding of the metal films 32 and 33 may be performed using a method other than the atomic diffusion bonding method described above. For example, in a case where a metal film is formed in advance on one or both of surfaces of the two bases disposed to face each other, in the vacuum container, an oxide or an organic substance on a surface of the metal film formed in advance by, for example, plasma-etching or the like is removed to activate the surface, making it possible to perform bonding to the other metal film.

1-3. Workings and Effects

As a bonding technique that bonds two or more to-be-bonded members, there is an inorganic bonding such as the atomic diffusion bonding. In the inorganic bonding, a bonding surface having a small arithmetic average roughness (Ra) is desired in order to increase a contact area in a bonding interface and to secure a bonding force. For example, a glassy homogeneous material is easy to achieve the bonding surface having the small arithmetic average roughness (Ra) by a polishing process, and thus there are many practical examples in terms of the atomic diffusion bonding, optical contact, and the like.

Figure 3:
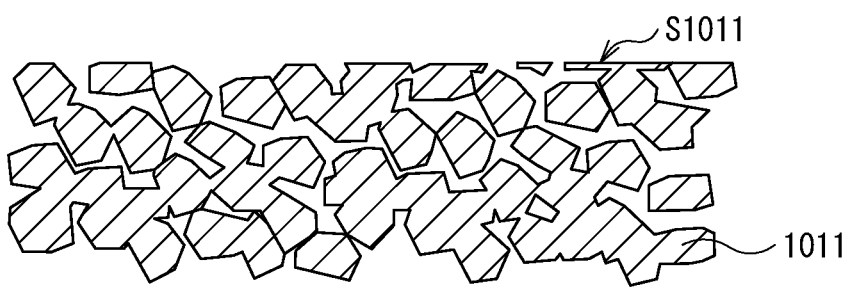
FIG. 3 is a schematic cross-sectional diagram illustrating a porous base whose surface is polished.

However, in a porous base material, such as ceramics, having a density lower than a density that is determined by a crystal structure and a composition of a constituent material, it is difficult to secure the bonding surface having the small arithmetic average roughness (Ra) by the polishing process, and it is difficult to obtain a sufficient bonding strength. For example, in a case where a surface of the porous base material (a porous base 1011) is directly polished, a flatness of the surface is improved but the arithmetic average roughness (Ra) is hardly changed, for example, as illustrated in FIG. 3. For example, in a case where YAG ceramics is polished by optical polishing, the arithmetic average roughness (Ra) is limited to about 2.0 nm, and no further improvements are observed. This is because the YAG ceramics is a sintered body of a large number of particles, and voids present in the structure are exposed by polishing of the particles on the surface even when the optical polishing is performed.

Figure 4:
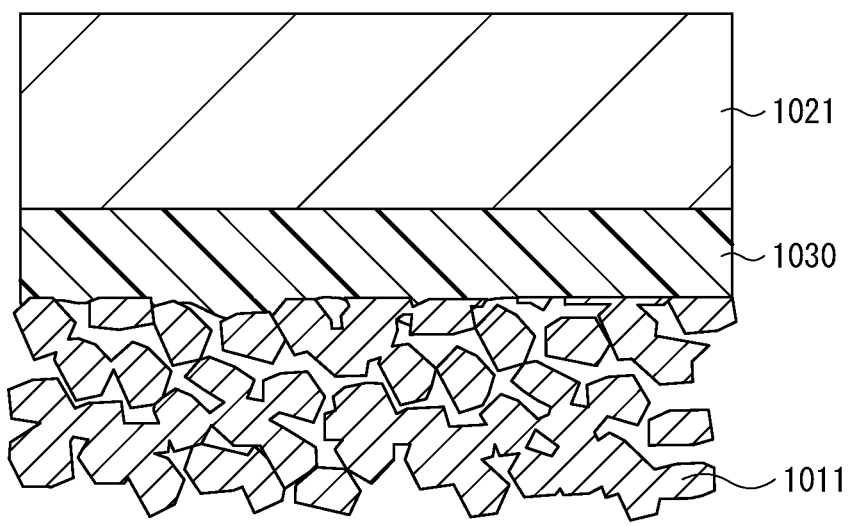
FIG. 4 is a schematic cross-sectional diagram illustrating the structure body using the porous base illustrated in FIG. 3.

In a case where the atomic diffusion bonding with the base (a base 1021) is performed with such a plane S1011 serving as the bonding surface, a bonding surface in the porous base 1011 and a metal layer 1030 formed between the porous base 1011 and the base 1021 becomes a point contact, for example, as illustrated in FIG. 4. Therefore, it is difficult to obtain a sufficient bonding strength for a bonding body in which the porous base material is used, as compared with a bonding body in which a glassy homogeneous material such as quartz is used. The bonding body in which the glassy homogeneous material such as quartz is used makes it possible to improve a surface roughness to the arithmetic average roughness (Ra) of 0.5 nm or less by which a sufficient bonding strength is obtained.

In contrast, in the structure body 1 of the present embodiment, the buffer layer 31 containing at least a metal element is provided between the porous base 11 having the large arithmetic average roughness (Ra) and the base 21. The buffer layer 31 is derived from the foundation layer 31A provided on the porous base 11 in the bonding process step with the base 21. The foundation layer 31A is vitreous, for example, and allows for the formation of the smooth surface having the small arithmetic average roughness (Ra) by the polishing process. In other words, in the present embodiment, the foundation layer 31A that includes the inorganic oxide that is superior in polishing processability is provided on the porous base 11 having the large arithmetic average roughness (Ra). Hence, it is possible to secure smoothness on the porous base 11, and to allow for the bonding that uses, for example, the atomic diffusion bonding.

As described above, in the present embodiment, the foundation layer 31A that includes the inorganic material that is superior in polishing processability is provided on the porous base 11 having the large arithmetic average roughness (Ra) and the polishing thereof is performed to form the bonding surface having the small arithmetic average roughness (Ra). Thus, for example, in the bonding that uses the atomic diffusion bonding, it is possible to improve the bonding strength of the structure body 1 that uses the porous base 11 having the large arithmetic average roughness (Ra) as the to-be-bonded member.

Hereinafter, the second embodiment and modification examples will be described. In the following description, the same components as those of the first embodiment are denoted by the same reference numerals, and description thereof will be omitted as appropriate.

2. Second Embodiment

Figure 5:
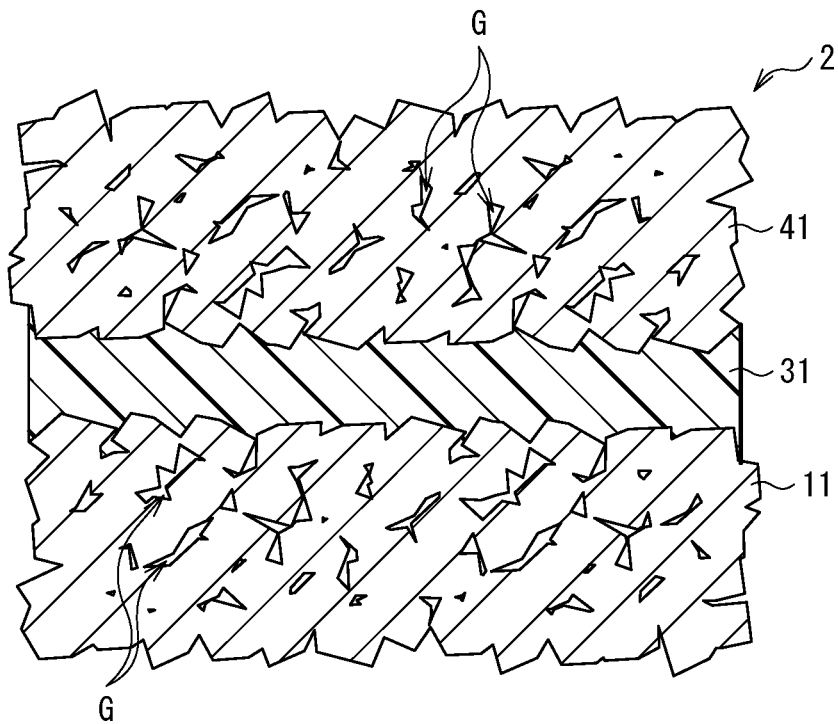
FIG. 5 is a schematic cross-sectional diagram illustrating an example of a configuration of a structure body according to a second embodiment of the present disclosure.
Figure 6:
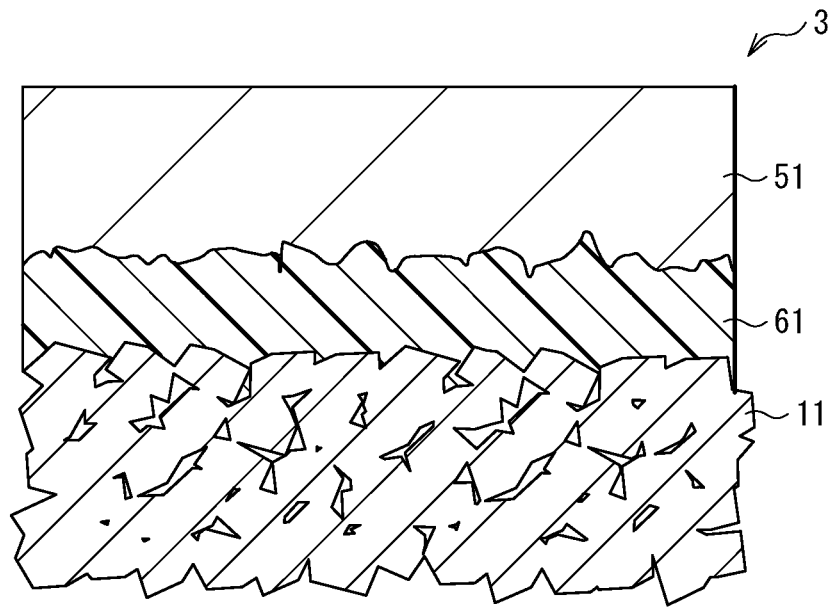
FIG. 6 is a schematic cross-sectional diagram illustrating another example of the configuration of the structure body according to the second embodiment of the present disclosure.

FIG. 5 schematically illustrates an example of a cross-sectional configuration of a structure body (the structure body 2) according to the second embodiment of the present disclosure. FIG. 6 schematically illustrates another example of the cross-sectional configuration of the structure body (the structure body 3) according to the second embodiment of the present disclosure. As with the first embodiment described above, the structure bodies 2 and 3 each have a laminated structure in which two or more to-be-bonded members are bonded by, for example, the atomic diffusion bonding, for example, to structure a laser amplifier (e.g., see FIG. 16).

In the first embodiment described above, an example has been described in which the base 21 having a flat bonding surface that includes an inorganic material, a plastic material, or the like is used as the to-be-bonded member with the porous base 11, but the to-be-bonded member with the porous base 11 is not limited thereto.

For example, as with the structure body 2 illustrated in FIG. 5, it is possible to use a base (a porous base 41) having the large arithmetic average roughness (Ra) as the to-be-bonded member with the porous base 11. As with the structure body 1 of the first embodiment, the structure body 2 is formed by bonding the porous base 11 having the large arithmetic average roughness (Ra) and the porous base 41 with the buffer layer 31 therebetween. As with the porous base 11, the porous base 41 has a density lower than a density that is determined by a crystal structure and a composition of a constituent material, and has, for example, the plurality of voids G in a layer, so that the density is lower than that of a crystal body. The porous base 41 has, for example, the arithmetic average roughness (Ra) of 2 nm or more and the plurality of voids G of, for example, 0.5 μm or more and 50 μm or less. Examples of the porous base 41 include a sintered body such as ceramics and the like. In the present embodiment, it is preferable that the buffer layer 31 have a thickness of, for example, 10 nm or greater and 10 μm or less.

As illustrated in FIG. 5, in a case where the porous bases are to be bonded to each other, a foundation layer is first formed on the porous base 41, and a surface thereof is polished to form a surface having the small arithmetic average roughness (Ra) of 0.5 nm or less, for example, as with the porous base 11. Subsequently, a metal film having a microcrystal structure is formed on the foundation layer, as with the metal film 32 formed on the foundation layer 31A in the first embodiment described above. The porous base 11 and the porous base 41 are disposed face-to-face so that the metal film and the metal film 32 that is provided on the porous base 11 face each other, and are bonded by applying a pressure (P) from the porous base 41 side, for example. Thus, the structure body 2 illustrated in FIG. 5 is completed.

Further, it is also possible to use the metal base (a metal base 51) having the large arithmetic average roughness (Ra) as the to-be-bonded member with the porous base 11, as with the structure body 3 illustrated in FIG. 6. The structure body 3 is formed by bonding the porous base 11 having the large arithmetic average roughness (Ra) and the metal base 51 to each other with a buffer layer 61 therebetween. In a case where the metal base 51 is used as the to-be-bonded member, as described above, it is possible to induce elastic deformation and plastic deformation in the bonding base by applying a predetermined pressure at the time of the bonding. In such a metal base 51, the arithmetic average roughness (Ra) may be, for example, 3 nm or less. Examples of a metal material structuring the metal base 51 include stainless-steel, aluminum (Al), iron (Fe), copper (Cu), magnesium (Mg), and zinc (Zn). In a case where the to-be-bonded member which can be elastically deformed or plastically deformed by the application of pressure is used as with the structure body 3, a thickness of the metal film 32 is preferably 10 nm or greater and 200 nm or less, for example.

Hereinafter, a method of manufacturing the structure body 3 will be described.

Using methods similar to those in the first embodiment described above, the porous base 11 in which the foundation layer 31A and the metal film 32 are formed is prepared. Subsequently, a metal film 63 is formed on a surface of the metal base 51 having the large arithmetic average roughness (Ra), and the porous base 11 and the metal base 51 are disposed face-to-face so that the metal film 32 and the metal film 63 face each other.

The metal film 63 has the microcrystal structure as with the metal film 32, and includes the metal material described above or a metalloid. Preferably, a thickness of the metal film 63 is such that the area to be bonded has a sufficient thickness in consideration of deformation of the metal film 32, the metal film 63, and the metal base 51 resulting from the application of pressure, and is preferably, for example, 10 nm or greater and 200 nm or less.

It is possible to form the metal film 63 using a method similar to that of the metal film 32 described above. First, for example, in a vacuum container where the ultimate vacuum is a high degree of vacuum of $1 \times 10^{-4}$ to $1 \times 10^{-8}$ Pa, for example, the PVD such as a sputtering method or ion plating, the CVD method, or various deposition methods is used to form a film of, for example, a Ti film having a thickness of 0.2 nm or greater and 200 nm or less. Note that in a case where a metal material having a relatively low diffusing speed is to be used, it is preferable to form the film by a vacuum-deposition method or a sputtering method in which the film formation is performed with the plasma capable of increasing the inner stress of the formed metal film 53 being generated.

A pressure in the vacuum chamber at the time of the film formation of the metal film 63 may be a vacuum atmosphere having the ultimate vacuum of $1 \times 10^{-4}$ to $1 \times 10^{-8}$ Pa, but a lower pressure (a higher vacuum degree) is preferable. Thus, for example, it becomes possible to use a material which is easily oxidized, such as Al.

In a case where the metal film 63 is to be formed using the sputtering method, it is preferable that a pressure of an inert gas (generally, an argon (Ar) gas) at the time of film formation be in a dischargeable region (e.g., 0.1 Pa or greater). However, because there is a possibility that the bonding exceeding 30 Pa (300 μbar) is not performable, an upper limit is preferably set to 30 Pa (300 μbar) or less. This is because the arithmetic average roughness Ra of the metal film 63 to be formed increases as the Ar-gas pressure rises. Note that the metal film 63 may be formed using a film-formation process having a self-smoothing effect. In such a case, the surface of the metal film 63 becomes smooth, allowing for the bonding even when the arithmetic average roughness (Ra) of the bonding surface is large.

Note that the film formation of the metal films 32 and 63 and the bonding of the metal film 32 and the metal film 63 to be described later are desirably performed in the same device under a vacuum condition. Thus, oxidation of the surfaces of the metal films 32 and 63 is reduced, making it possible to perform the good bonding.

Figure 7A:
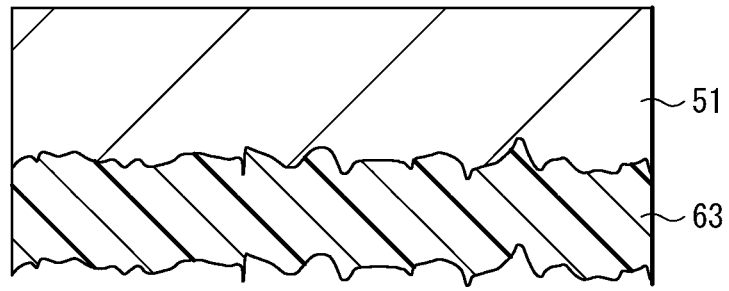
FIG. 7A is a schematic cross-sectional diagram illustrating an example of a method of manufacturing the structure body illustrated in FIG. 6.
Figure 7B:
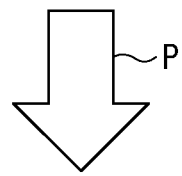
FIG. 7B is a schematic cross-sectional diagram illustrating a process step following FIG. 7A.
Figure 7B:
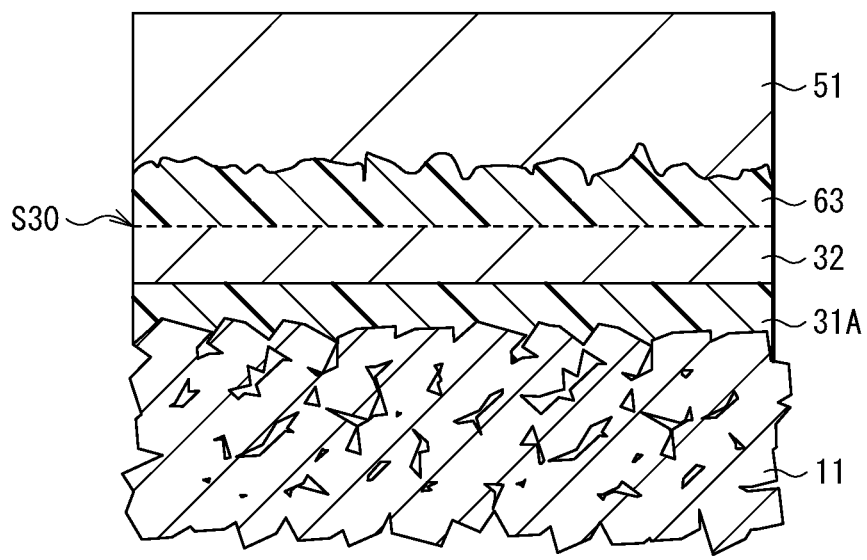

Subsequently, as illustrated in FIG. 7B, the metal film 32 and the metal film 63 are superimposed, for example, by using the atomic diffusion bonding method, and a pressure (P) is applied from the base 51 side, for example. At this time, the metal base 51 and the metal film 63 are deformed, and the contacting area with the opposing metal film 32 is increased. This makes it possible to cause atomic diffusion at the bonding interface and grain boundaries between the metal film 63 and the metal film 63 and to perform the bonding in which the bonding strain is relaxed. Thus, the structure body 3 illustrated in FIG. 6 is completed.

As described above, in the structure body 2 of the present embodiment, the foundation layer (e.g., foundation layer 31A) is provided on each of the porous bases 11 and 41 having the large arithmetic average roughness (Ra), and the surfaces thereof are polished to form the surfaces having the small arithmetic average roughness (Ra) of, e.g., 0.5 nm or less, following which the metal film (e.g., the metal film 32) is formed on each of the foundation layers to perform the bonding. In the structure body 3 of the present embodiment, the metal base (the metal base 51) having the large arithmetic average roughness (Ra) is used as the to-be-bonded member of the porous base 11, and the metal film 63 similar to the metal film 32 provided on the foundation layer 31A in the first embodiment described above is provided on the bonding surface side to the porous base 11 to perform the bonding with the metal film 32 provided on the porous base 11 side. Hence, it is possible to form the structure body superior in bonding strength without limiting the to-be-bonded member with the porous base 11.

3. Modification Examples 3-1. Modification Example 1

Figure 8:
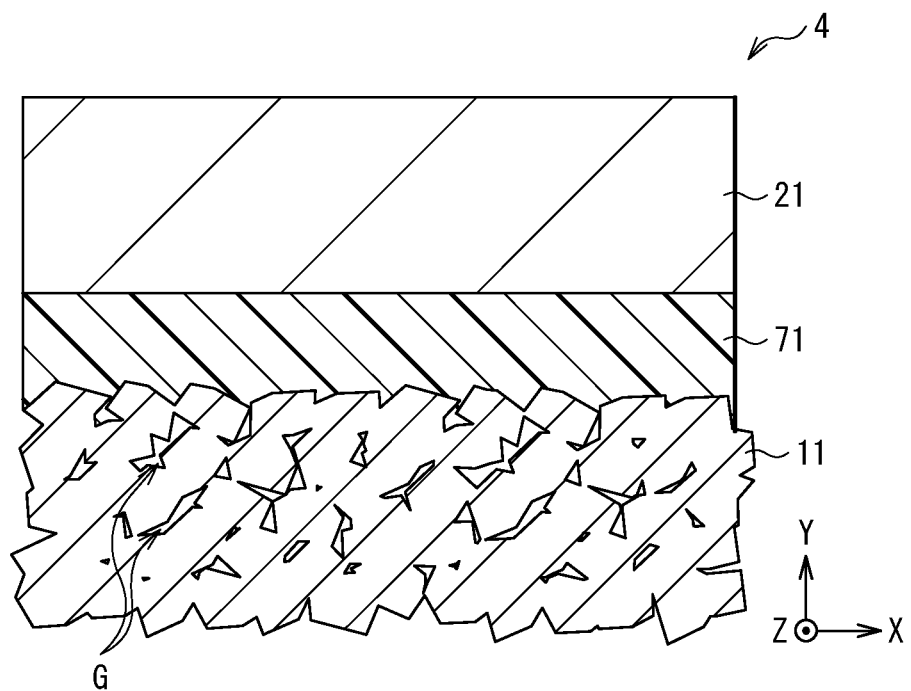
FIG. 8 is a schematic cross-sectional diagram illustrating a configuration of a structure body according to modification example 1 of the present disclosure.

FIG. 8 schematically illustrates an example of a cross-sectional configuration of a structure body (a structure body 4) according to modification example 1 of the present disclosure. As with the first embodiment described above, the structure body 4 has a laminated structure in which two or more to-be-bonded members are bonded together by, for example, the atomic diffusion bonding, and constitutes, for example, an optical member having a light permeability such as a laser amplifier, a prism, or the like, besides a wavelength conversion device used for a projector or the like (for example, see FIG. 9A). In the present modification example, as with the first embodiment described above, a case is described as an example in which the porous base 11 having the large arithmetic average roughness (Ra) and the base 21 having a flat surface as the bonding surface are used.

A buffer layer 71 is a junction that bonds the porous base 11 and the base 21. As with the first embodiment, etc., described above, the buffer layer 71 includes a foundation layer 71A and metal films 72 and 73 formed in manufacturing process steps, and further has a light permeability in the present modification example.

The buffer layer 71 includes, for example, an inorganic material (an inorganic oxide) bonded with, for example, oxygen derived from the foundation layer 71A. Specific examples include silicon oxide ($SiO_x$), aluminum oxide ($AlO_x$), niobium oxide ($NbO_x$), titanium oxide ($TiO_x$), tantalum oxide ($Ta_2O_5$), aluminum lanthanum oxide ($AlLaO_x$), titanium lanthanum oxide ($TiLaO_x$), and hafnium oxide ($HfO_x$). The buffer layer 71 further includes aluminum (Al), titanium (Ti), vanadium (V), chromium (Cr), iron (Fe), cobalt (Co), nickel (Ni), copper (Cu), zinc (Zn), gallium (Ga), germanium (Ge), zirconium (Zr), niobium (Nb), molybdenum (Mo), ruthenium (Ru), rhodium (Rh), palladium (Pd), silver (Ag), indium (In), tin (Sn), hafnium (Hf), tantalum (Ta), and the like derived from the metal films 72 and 73. In addition, the buffer layer 71 may include an inorganic nitride such as silicon nitride (SiN), an inorganic oxynitride such as silicon oxynitride (SiON), an inorganic fluoride such as silicon fluoride ($SiF_x$), or the like. In the present embodiment, the buffer layer 71 preferably has a thickness of 10 nm or greater and 10 μm or less, for example.

Note that the inorganic oxide structuring the buffer layer 71 may be a crystalline solid or a vitreous solid (amorphous solid).

In the buffer layer 71, as with the first embodiment described above, the metal element is locally distributed in the film-thickness direction. The metal element is derived from the metal films 72 and 73. As will be described in detail later, for the metal element structuring the metal films 72 and 73, oxygen atoms constituting the foundation layer (in the present modification example, the foundation layer 71A)

diffuse toward the metal film 72 that is in contact with the foundation layer 71A in an annealing treatment after the bonding of the metal film 72 and the metal film 73. By the diffusion of the metal element and the disturbance of bonding interface, it is possible to confirm the density distribution of the metal element which continuously decreases in a predetermined range from the interface with the base 21 to the interface of the porous base 11 by the diffusion of the oxygen atoms from the foundation layer 71A described above, in a case where a distribution of the metal element in the buffer layer 71 is measured by, for example, the EDX, the EELS, the SIMS, TOF-SIMS spectroscopy, or the like. Further, for example, in a case where both the porous base 11 and the porous base 41 are provided with the foundation layers as in the structure body 2 of the second embodiment, it is possible to confirm the density distribution of the metal element which continuously decreases in a predetermined range from the inside of a layer of the buffer layer 71 toward the interfaces of the porous base 11 and the base 21. Incidentally, in a case where a stability of chemical bond between the oxygen atoms constituting the foundation layer (in the present modification example, the foundation layer 71A) and the metal element of the metal films 72 and 73 is high, in a case where the surface roughness Ra of the buffer layer is small, or the like, the continuous decrease in the metal element becomes steep and may sometimes be observed as a concentration distribution existing rectangularly within a predetermined range.

Hereinafter, a method of manufacturing the structure body 4 will be described.

Figure 9A:
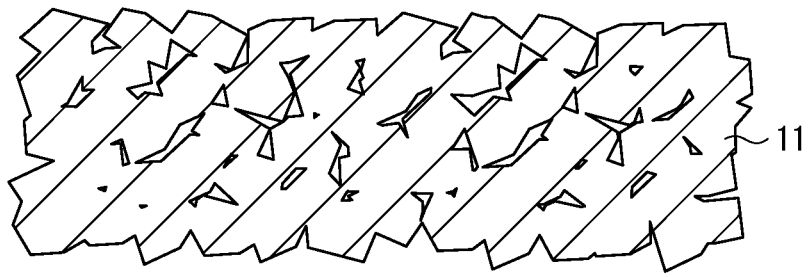
FIG. 9A is a schematic cross-sectional diagram illustrating an example of a method of manufacturing the structure body illustrated in FIG. 8.
Figure 9B:
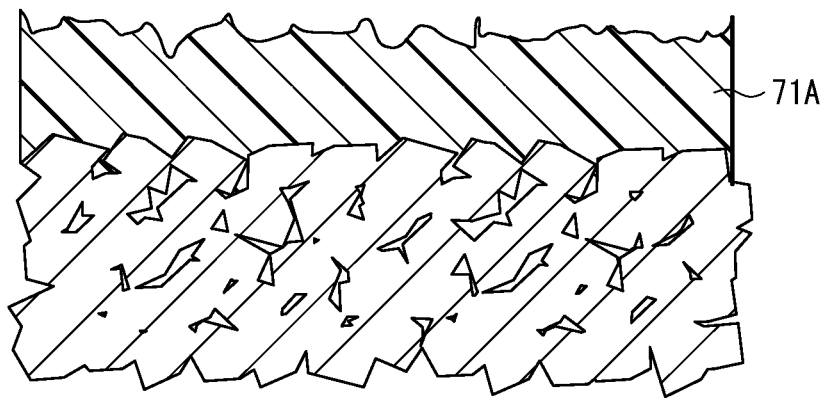
FIG. 9B is a schematic cross-sectional diagram illustrating a process step following FIG. 9A.

First, as illustrated in FIG. 9A, the porous base 11 is prepared. Next, as illustrated in, for example, FIG. 9B, the foundation layer 71A is formed on a bonding surface of the porous base 11 by, for example, a vacuum deposition method using an electronic beam to a thickness of, for example, 10 nm or greater and 10 µm or less by considering a polishing amount and a roughness of a surface of the porous base 11. Note that the foundation layer 71A may be formed using the IAD method, the sputtering method, the ion plating method, the CVD method, and the like, besides the vacuum deposition method.

The foundation layer 31A is an inorganic material (an inorganic oxide) chemically bonded with oxygen, and it is preferable to use a material having a good polishing processability. In addition, a material capable of containing oxygen in the voids formed in a layer by grain boundaries or the like by physical adsorption may be used. In any of the materials, it is preferable that the material be a material having a lower oxygen-bonding force than the metal material used for the metal films 72 and 73. Examples include inorganic oxides such as silicon oxide ($SiO_x$), metal oxides such as aluminum (Al), titanium (Ti), vanadium (V), chromium (Cr), iron (Fe), cobalt (Co), nickel (Ni), copper (Cu), zinc (Zn), gallium (Ga), germanium (Ge), zirconium (Zr), niobium (Nb), molybdenum (Mo), ruthenium (Ru), rhodium (Rh), palladium (Pd), silver (Ag), indium (In), tin (Sn), hafnium (Hf), and tantalum (Ta). A thickness of the foundation layer 71A is preferably formed as a thickness of, for example, 10 nm or greater and 10 µm or less as described above, but is not limited thereto.

Here, the oxygen binding force is defined as follows. For example, the oxygen bonding force of the metal material constituting the metal films 72 and 73 in a case where titanium (Ti) is used as the metal material constituting the metal films 72 and 73 is a chemical bonding force between a titanium atom and an oxygen atom. Further, the oxygen bonding force of an oxygen supply material in a case where silicon oxide ($SiO_2$) is used as the oxygen supply material includes a chemical bonding force between a silicon atom and the oxygen atom and a bonding force between silicon oxide ($SiO_2$) and oxygen that is non-covalently trapped. It is to be noted that the non-covalent property includes oxygen trapped through water and oxygen trapped in a film.

Figure 9C:
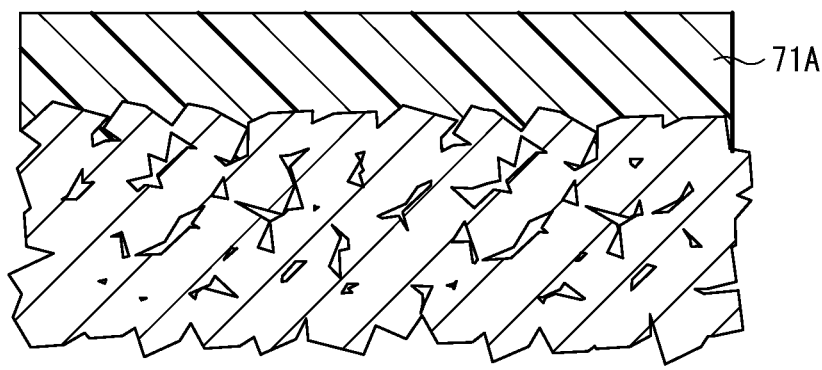
FIG. 9C is a schematic cross-sectional diagram illustrating a process step following FIG. 9B.

Subsequently, as illustrated in FIG. 9C, for example, polishing by physical or chemical action is performed to reduce the arithmetic average roughness (Ra) of the foundation layer 71A. Specifically, a surface of the foundation layer 71A preferably has smoothness, and preferably has the arithmetic average roughness (Ra) of, for example, 0.5 nm or less.

Note that the foundation layer 71A may be formed using a film-formation process having a self-smoothing effect. In this case, the polishing process described above is unnecessary. Further, for the foundation layer 71A, besides the material having a good polishing processability as described above, a method of securing a bonding area by means of a perimeter by forming, on a base, a film of a resin which is easily deformed is also effective. It is further effective to use a highly wettable resin in which a surface roughness of a resin surface is reduced by surface tension.

Figure 9D:
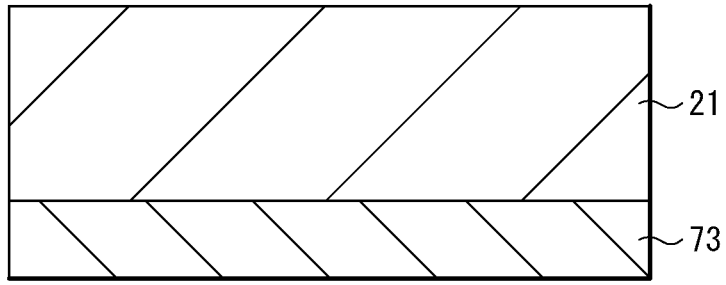
FIG. 9D is a schematic cross-sectional diagram illustrating a process step following FIG. 9C.
Figure 9D:
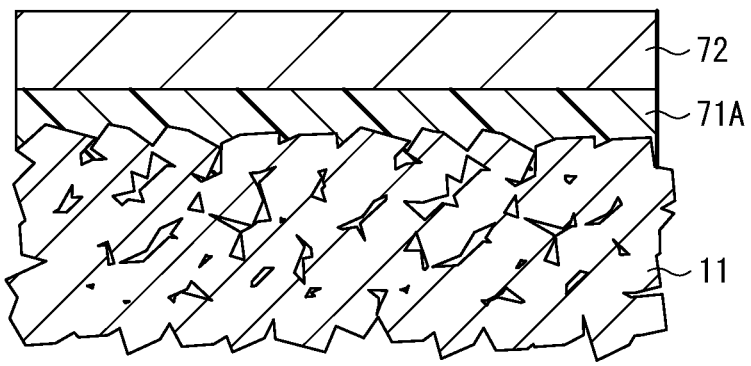

Next, as illustrated in FIG. 9D, the metal film 72 having, for example, a microcrystal structure is formed on the foundation layer 71A, and the base 21 is prepared in which the metal film 73 is formed on a surface using a similar method. Subsequently, the porous base 11 and the base 21 are disposed face-to-face so that the metal film 72 on the porous base 11 and the metal film 73 on the base 21 face each other.

The metal films 72 and 73 have a microcrystal structure, and includes, for example, a metal such as aluminum (Al), titanium (Ti), zirconium (Zr), niobium (Nb), hafnium (Hf), and tantalum (Ta) which are made transparent by oxidization. In the present modification example, as will be described later, the metal film 32 and the metal film 33 are superimposed to bond the porous base 11 and the base 21 using the atomic diffusion bonding method. At this time, if the surfaces of the foundation layer 31A and the base 21 are smooth, it is possible to perform the bonding even when the metal films 72 and 73 are extremely thin films having a thickness of 0.2 nm, for example.

Note that the film formation of the metal films 72 and 73 and the bonding of the metal film 72 and the metal film 73 to be described later are desirably performed in the same device under a vacuum condition. Thus, oxidation of the surfaces of the metal films 72 and 73 is reduced, making it possible to perform the good bonding.

Figure 9E:
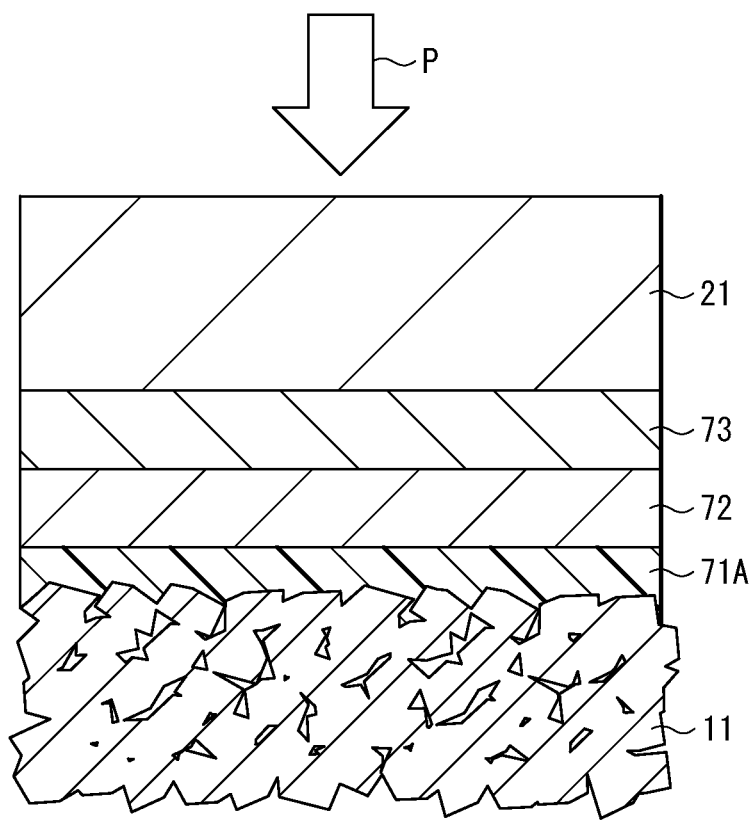
FIG. 9E is a schematic cross-sectional diagram illustrating a process step following FIG. 9D.

Subsequently, as illustrated in FIG. 9E, the porous base 11 and the base 21 are bonded, for example, by using the atomic diffusion bonding method, through superimposing the metal film 72 and the metal film 73 on each other and applying a pressure (P) from the base 21 side, for example. This makes it possible to cause atomic diffusion at the bonding interface and grain boundaries between the metal film 72 and the metal film 73 and to perform the bonding in which the bonding strain is relaxed. Lastly, the bonded porous base 11 and base 21 are left under an environment of, for example, 100° C. or more and 800° C. or less as the annealing treatment. As a result, the buffer layer 71 in which the metal element is locally distributed in the film-thickness direction is formed between the porous base 11 and the base 21. Thus, the structure body 4 illustrated in FIG. 8 is completed.

Note that the bonding of the metal films 72 and 73 may be performed using a method other than the atomic diffusion bonding method described above. For example, in a case where a metal film is formed in advance on one or both of surfaces of the two bases disposed to face each other, in the vacuum container, an oxide or an organic substance on a surface of the metal film formed in advance by, for example, plasma-etching or the like is removed to activate the surface, making it possible to perform bonding to the other metal film.

In addition, it is preferable that metal film 72 have the thickness that allows the metal material structuring the metal film 72 to be sufficiently oxidized by oxygen generated from the foundation layer 71A, and it is desirable that the thickness of the metal film 72 be sufficiently thin as compared with the foundation layer 71A. The bonding strength increases in strength as the oxidation of the metal films 72 and 73 progresses. The thickness of the metal films 72 and 73 varies depending on the presence or absence of the light permeability of the buffer layer 71. For example, in the present modification example in which the buffer layer 71 has the light permeability, it is preferable that the thickness of the metal films 72 and 73 be 0.2 nm or greater and 10 nm or less, for example.

The annealing treatment may be carried out under the same conditions as the film formation of the metal films 72 and 73 and the bonding of the metal film 72 and the metal film 73, or may be carried out outside an apparatus, for example, in the atmosphere. Further, 100° C. which is a lower limit temperature of the annealing treatment is exemplified as a temperature equal to or higher than an environmental temperature at which the structure body 1 is to be used. An upper limit temperature of 800° C. is based on a softening point of optical glasses used for the porous base 11, the base 21, and the foundation layer 71A in a case where the structure body 1 is used as an optical device, a melting point of a metal, and a breaking temperature due to a thermal stress of a thin film. Therefore, a temperature of the annealing treatment is not limited to the range described above, and for example, in a case where a stable metal oxide film is formed even within a range of the environmental temperature at which the structure body 1 is to be used, it is preferable to perform the treatment at 100° C. or less. For example, in a case where the bonding between a low melting point glass or the porous base 11 having a different thermal expansion coefficient and the base 21 is to be performed, the annealing treatment is preferably performed in an environment of, for example, 300° C. or less, and more preferably, for example, 100° C. or less. For example, depending on a film-formation process and a film forming material, it is possible to oxidize the metal films 72 and 73 by leaving them at an ordinary temperature. Further, increasing the voids in a layer by decreasing a density of the foundation layer 71A results in more water that is to be physically absorbed. Thus, oxygen to be supplied from an oxygen supply layer is increased, and the oxidization of the metal films 72 and 73 is promoted at the ordinary temperature.

Note that a laser or electromagnetic wave heating may be used as a process for promoting the oxidization of the metal films 72 and 73, and the heating thereof may be localized.

As described above, in the present modification example, a material having the low oxygen bonding force is used as the material of the foundation layer 71A, and the annealing treatment is further performed after the bonding of the metal film 72 and the metal film 73. Thus, the metal element constituting the metal film 72 and the metal film 73 is oxidized, allowing the buffer layer 71 to have the light permeability.

3-2. Modification Example 2

Figure 10:
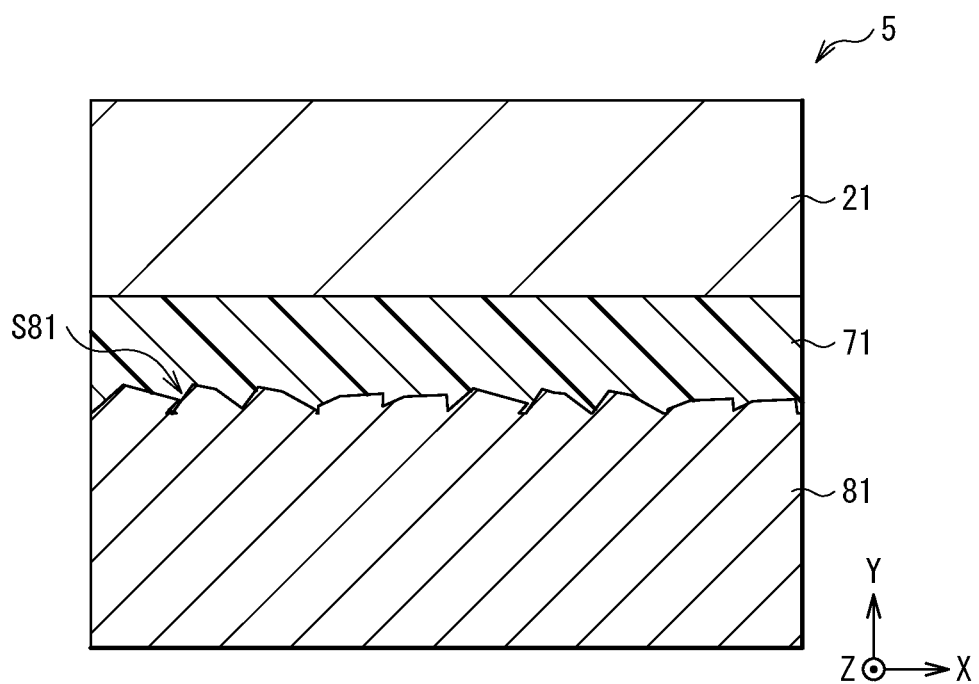
FIG. 10 is a schematic cross-sectional diagram illustrating a configuration of a structure body according to modification example 2 of the present disclosure.

FIG. 10 schematically illustrates a cross-sectional configuration of a structure body (a structure body 5) according to modification example 2 of the present disclosure. The structure body 5 has a laminated structure in which two or more to-be-bonded members are bonded together by, for example, the atomic diffusion bonding, and constitutes, for example, a cemented lens that corrects a chromatic aberration or a polarization separating prism used for a projector. In the structure body 5 of the present modification example, a difficult-to-process base 81 and the base 21 are bonded to each other, for example, by the atomic diffusion bonding, with the buffer layer 31 containing at least a metal element therebetween.

The difficult-to-process base 81 has a density lower than a density that is determined by a crystal structure and a composition of a constituent material thereof, and is, for example, a difficult-to-process glass material having a degree of abrasion of 300 or more. Examples of the difficult-to-process base 81 include a phosphoric-acid-based glass material, a fluorophosphate-based glass material (e.g., a fluorophosphate glass configured by a phosphoric acid ($P_2O_5$) and fluoride (e.g., $AlF_3$ or $CaF_2$, etc.) or a glass material containing lead oxide as a main component.

It is possible to bond the difficult-to-process base 81 and the base 21 for the manufacturing using, for example, a method similar to that in the first embodiment described above.

Although the difficult-to-process glass material allows the arithmetic average roughness (Ra) representing the roughness of the surface to be small by the polishing process, it tends to undergo a chemical reaction with a moisture in the atmosphere, a cleaning liquid, and an abrasive, and the roughness of a surface is roughened when it is left, or a surface is roughened by cleaning. Accordingly, it is difficult to keep the surface roughness low, and a surface tends to be rough at the time of bonding as illustrated in FIG. 10, for example.

In contrast, in the present modification example, the difficult-to-process base 81 and the base 21 are bonded to each other via the buffer layer 31 that contains at least a metal element, as with the first embodiment described above. Thus, it is possible to perform the bonding that uses, for example, the atomic diffusion bonding, even for a base material where it is difficult to keep the surface roughness low like the difficult-to-process base 81.

4. Examples

Next, Examples of a functional device (the structure bodies 1 to 5) described in the above embodiments and modification examples will be described. However, a configuration described below is merely an example, and it is possible to vary the configuration as appropriate.

Example 1

Figure 11A:
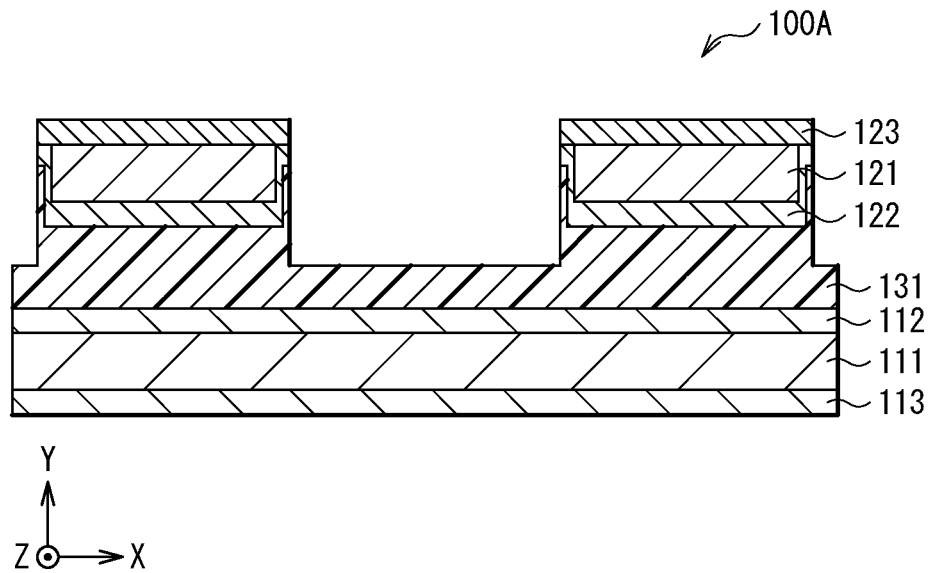
FIG. 11A is a schematic cross-sectional diagram illustrating an example of a phosphor wheel according to Example 1 of the present disclosure.
Figure 11B:
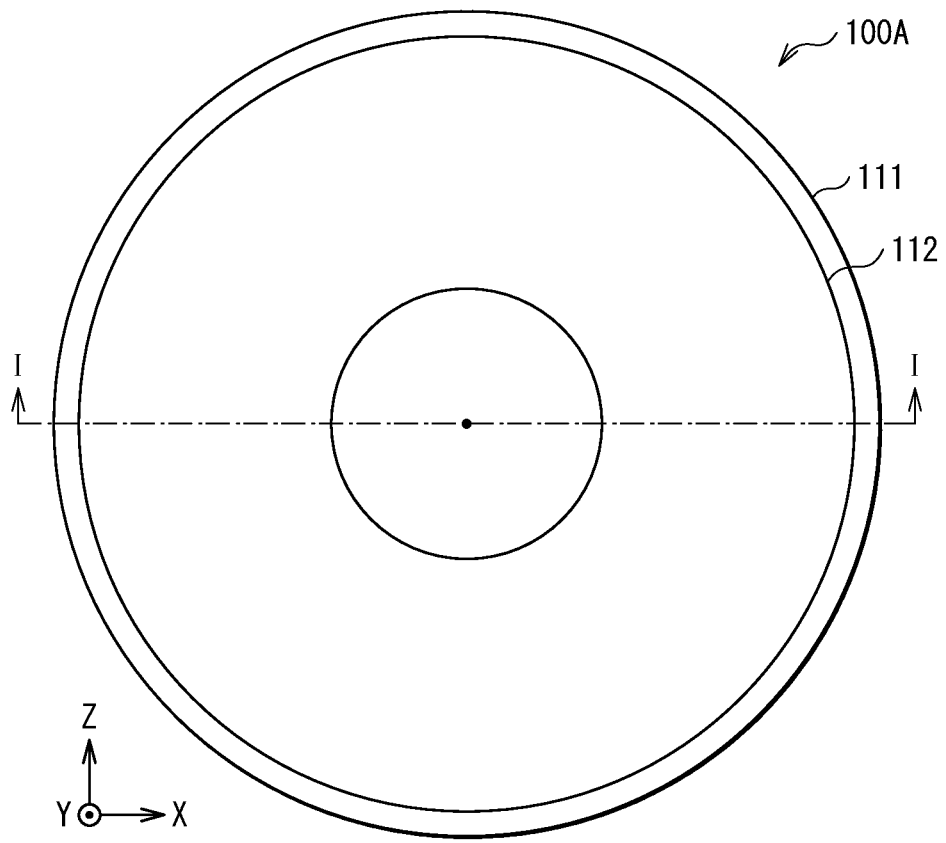
FIG. 11B is a schematic plan diagram illustrating the phosphor wheel illustrated in the FIG. 11A.

FIG. 11A schematically illustrates an example of a cross-sectional configuration of a phosphor wheel (a phosphor wheel 100A). FIG. 11B schematically illustrates an example of a plan configuration of the phosphor wheel 100A illustrated in FIG. 11A. Note that FIG. 11A illustrates a cross section taken along the line I-I illustrated in FIG. 11B. The phosphor wheel 100A is used, for example, as a transmission type wavelength conversion device in a light source section of a projector.

The phosphor wheel 100A has, for example, a configuration in which a dichroic film 112, a buffer layer 131, an interface reflection preventing film 122, and a phosphor layer 121 are stacked in this order on a rotatable wheel substrate 111. Further, reflection preventing films 113 and 123 are respectively provided on a back surface of the wheel substrate 111 and on the phosphor layer 121. The wheel substrate 111 is, for example, a sapphire substrate, and corresponds to the base 21 of the embodiments described above. The phosphor layer 121 has, for example, an annular shape, and is a plate-like ceramic phosphor, for example. The phosphor layer 121 corresponds to the porous base 11 in the embodiments described above. For example, the dichroic film selectively transmits light in a blue wavelength band and selectively transmits light in green and red wavelength bands. The interface reflection preventing film 122 is for reducing an interface reflection due to a refractive index difference between the buffer layer 131 and the phosphor layer 121. The dichroic film 112 and the interface reflection preventing film 122 correspond to one concrete example of a functional layer.

Hereinafter, a method of manufacturing the phosphor wheel 100A will be described.

Figure 12A:
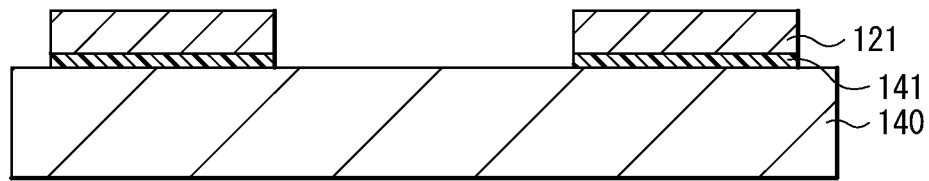
FIG. 12A is a schematic cross-sectional diagram illustrating an example of a method of manufacturing the phosphor wheel illustrated in FIG. 11A.
Figure 12B:
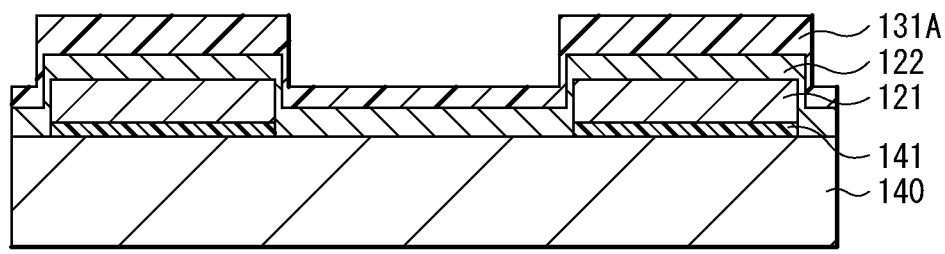
FIG. 12B is a schematic cross-sectional diagram illustrating a process step following FIG. 12A.

First, as illustrated in FIG. 12A, the phosphor layer 121 is fixed, via an adhesion layer 141, on a supporting substrate 140 that includes glass or the like. The supporting substrate 140 includes, for example, glass or the like. For example, it is possible to use an acrylic ultraviolet curable adhesive as the adhesion layer 141. Subsequently, as illustrated in the FIG. 12B, the interface reflection preventing film 122 configured by a dielectric multilayer film, for example, is formed on the supporting substrate 140 and the phosphor layer 121 by using the IAD, for example, following which a foundation layer 131A that includes silicon oxide ($SiO_x$), for example, is further formed. Next, a surface of the foundation layer 131A is reduced in surface roughness, e.g., to less than Ra=0.3 nm, e.g., by optical polishing.

Figure 12C:
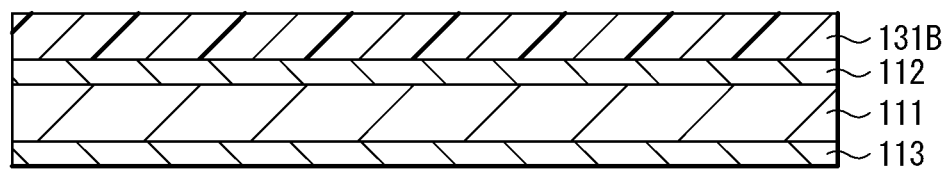
FIG. 12C is a schematic cross-sectional diagram illustrating a process step following FIG. 12B.
Figure 12D:
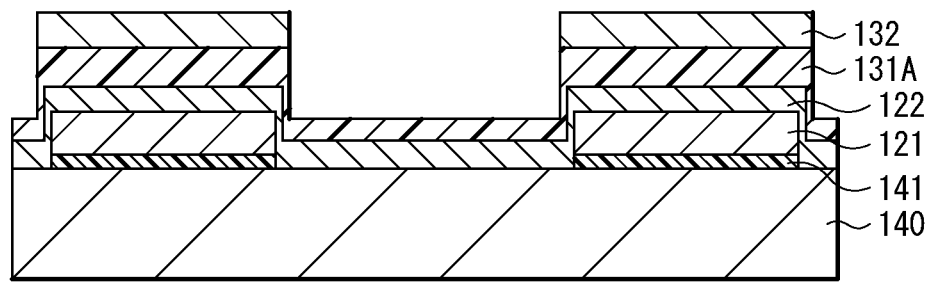
FIG. 12D is a schematic cross-sectional diagram illustrating a process step following FIG. 12C.
Figure 12D:
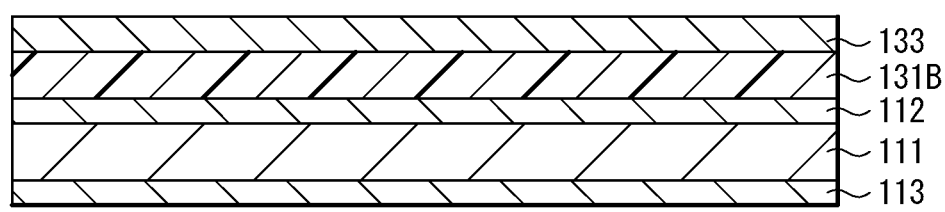
Figure 12E:
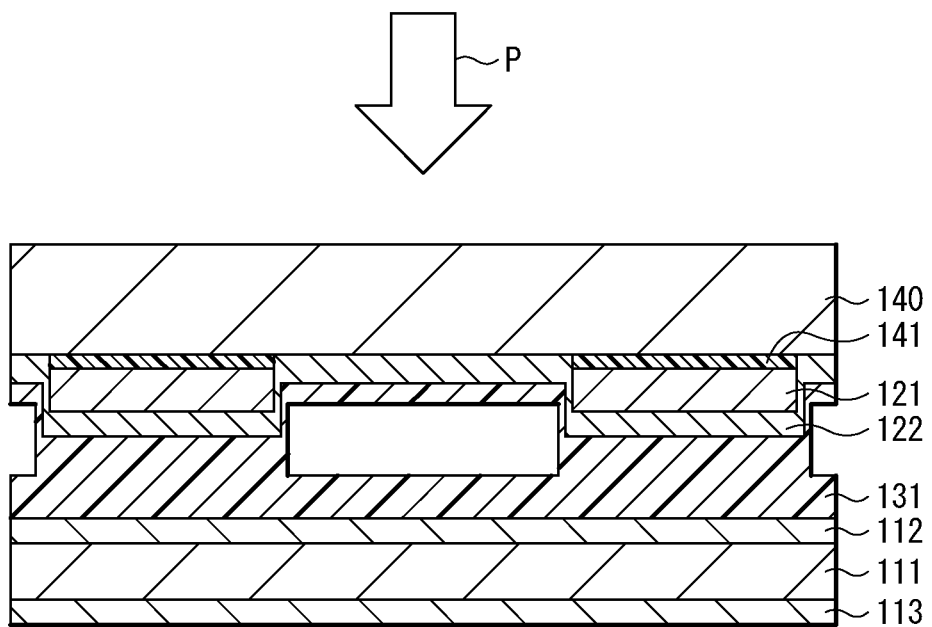
FIG. 12E is a schematic cross-sectional diagram illustrating a process step following FIG. 12D.
Figure 12F:
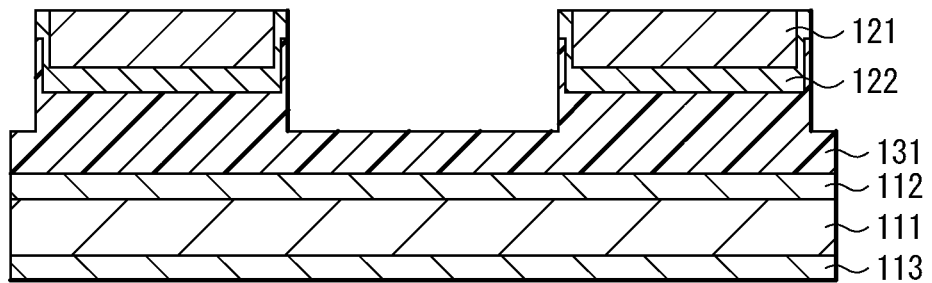
FIG. 12F is a schematic cross-sectional diagram illustrating a process step following FIG. 12E.

Subsequently, as illustrated in FIG. 12C, the dichroic film 112 is formed on the wheel substrate 111 using, for example, the IAD, following which a foundation layer 131B that includes, for example, silicon oxide ($SiO_x$) is further formed. As with the foundation layer 131A, a surface roughness of the foundation layer 131B is reduced to, for example, less than Ra=0.3 nm by, for example, optical polishing. Next, as illustrated in FIG. 12D, metal films 132 and 133 each configured by a Ti film are formed on the foundation layers 131A and 131B, following which, as illustrated in FIG. 12E, the metal film 132 and the metal film 133 are disposed to face each other, and are bonded by applying a pressure (P) thereto. After the bonding, the annealing treatment is performed to oxidize the metal films 132 and 133 by oxygen supplied from the foundation layers 131A and 131B, thereby making bonding surfaces transparent and strengthening the bonding force. Thus, the buffer layer 131 is formed between the dichroic film 112 and the interface reflection preventing film 122. Further, a resin structuring the adhesion layer 141 is thermally decomposed by the annealing treatment, and the supporting substrate 140 is removed as illustrated in FIG. 12F. Thereafter, the reflection preventing film 123 is formed on the phosphor layer 121. Thus, the phosphor wheel 100A is completed.

In the phosphor wheel 100A of the present Example, all of the members include an inorganic material, and heat resistance and light resistance are improved as compared with a case where adhesion is performed using an organic adhesive. Further, even when a temperature of a phosphor is increased by illumination of excitation light, an expansion occurs integrally with the wheel substrate 111 configured by a sapphire substrate which is close thereto in linear expansion coefficient, making it stronger against cracking.

Note that an example of the phosphor wheel 100A is described in which the sapphire substrate having the light permeability is used as the wheel substrate 111. However, for example, a metal substrate having light reflectivity may be used.

Figure 13:
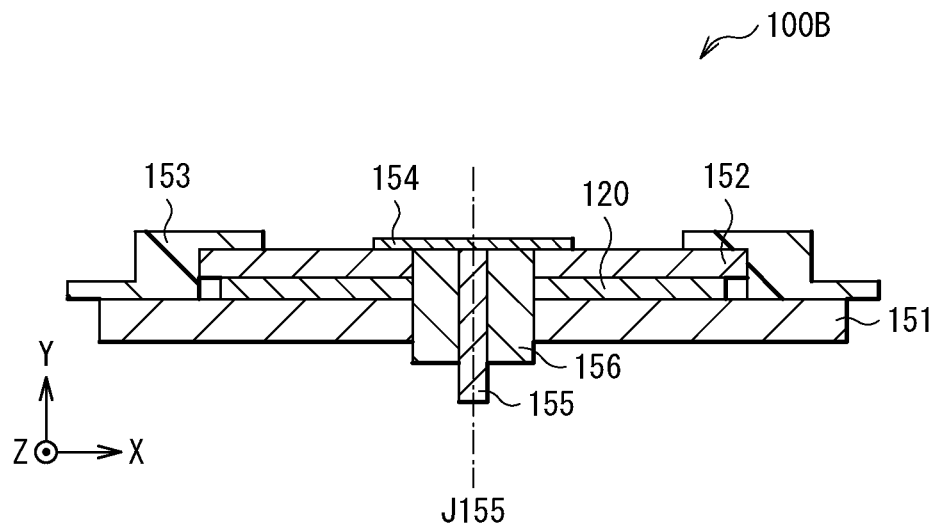
FIG. 13 is a schematic cross-sectional diagram illustrating another example of the phosphor wheel according to the Example 1 of the present disclosure.
Figure 14:
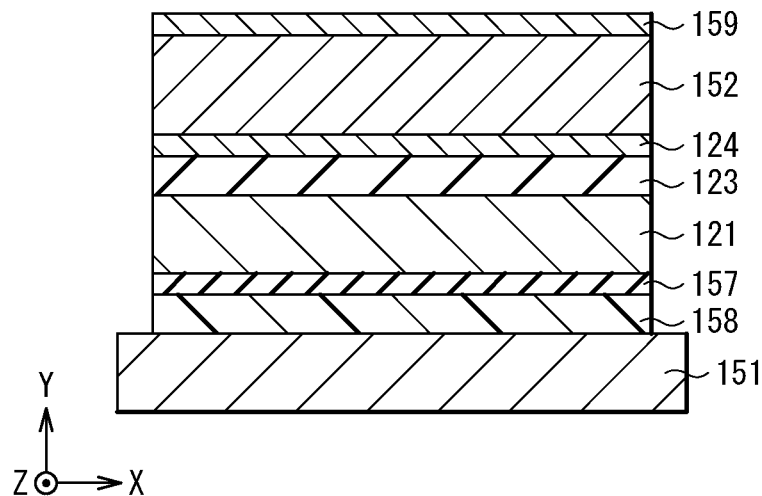
FIG. 14 is a schematic cross-sectional diagram illustrating an example of a configuration of the phosphor wheel illustrated in FIG. 13.

FIG. 13 schematically illustrates another example of the cross-sectional configuration of the phosphor wheel (a phosphor wheel 100B). FIG. 14 schematically illustrates an example of a cross-sectional configuration of the phosphor wheel 100B including a laminated structure of a light emission layer 120 illustrated in FIG. 13. The phosphor wheel 100B is used, for example, as a reflection type wavelength conversion device in a light source section of a projector.

The phosphor wheel 100B is formed by stacking the light emission layer 120 and the cover glass 152 in this order on a rotatable wheel substrate 151. The cover glass 152 is fixed to the wheel substrate 151 by, for example, a glass holder heat sink 153 and an inner plate. A shaft 155 and a motor 156 are attached to the center of the phosphor wheel 100B. The shaft 155 serves as an axis of rotation (e.g., an axis J155).

In the light emission layer 120, an adhesion layer 157, a dielectric multilayer film 158, the phosphor layer 121, the reflection preventing film 123, and an inorganic bonding layer 124 are stacked in this order from the wheel substrate 151 side. For example, the phosphor layer 121 and the cover glass 152 are bonded to each other by using the present technology. For example, the reflection preventing film 159 is provided on the cover glass 152.

In the reflective phosphor wheel 100B, the cover glass 152 that includes sapphire glass is bonded to a light extraction surface on the phosphor layer 121 that includes a ceramic phosphor, allowing heat generated at the phosphor layer 121 by illumination of the excitation light to be exhausted through the cover glass 152 in addition to the wheel substrate 151. That is, in the phosphor wheel 100B, in addition to the back surface on the wheel substrate 151 side, it is possible to form a waste heat path even on the excitation light incident side, thereby making it possible to reduce the temperature rise of the phosphor layer 121. Thus, it is possible to improve the fluorescence conversion efficiency. Further, in the phosphor wheel 100B in the present Example, it is possible to press the incident surface of the excitation light of the phosphor layer 121 collectively in surface by the cover glass 152, making it possible to prevent cracking due to partial thermal deformation generated by the temperature rise of the phosphor layer 121.

Although the present Example exemplifies a rotating type wavelength conversion device, the present technology is applicable to a non-rotating type wavelength conversion device.

Example 2

Figure 15A:
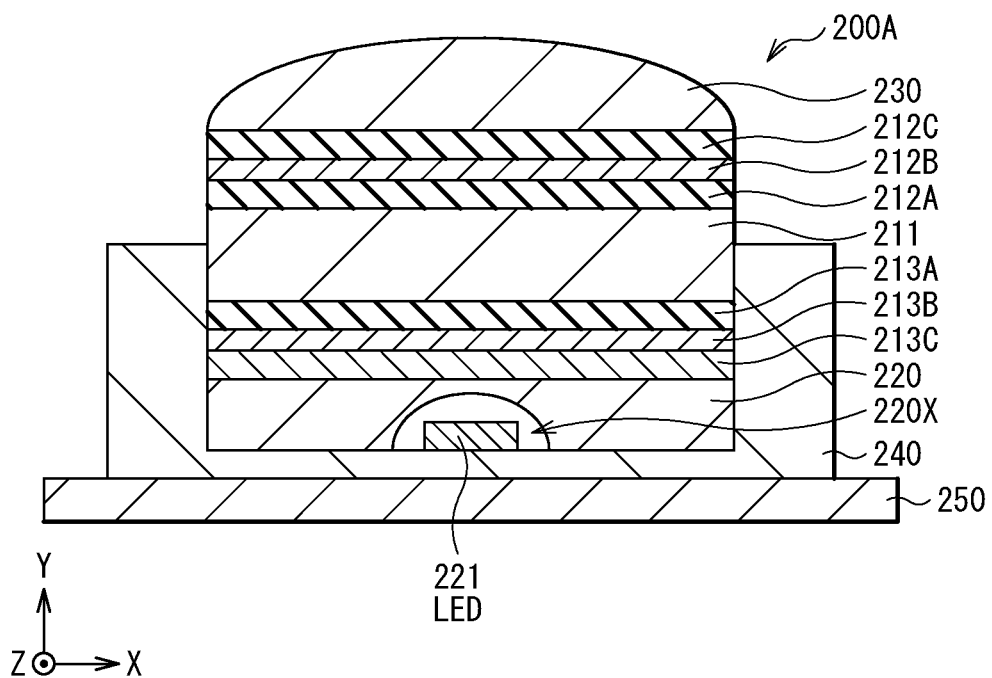
FIG. 15A is a schematic cross-sectional diagram illustrating an example of a configuration of a light-emitting device according to Example 2 of the present disclosure.
Figure 15B:
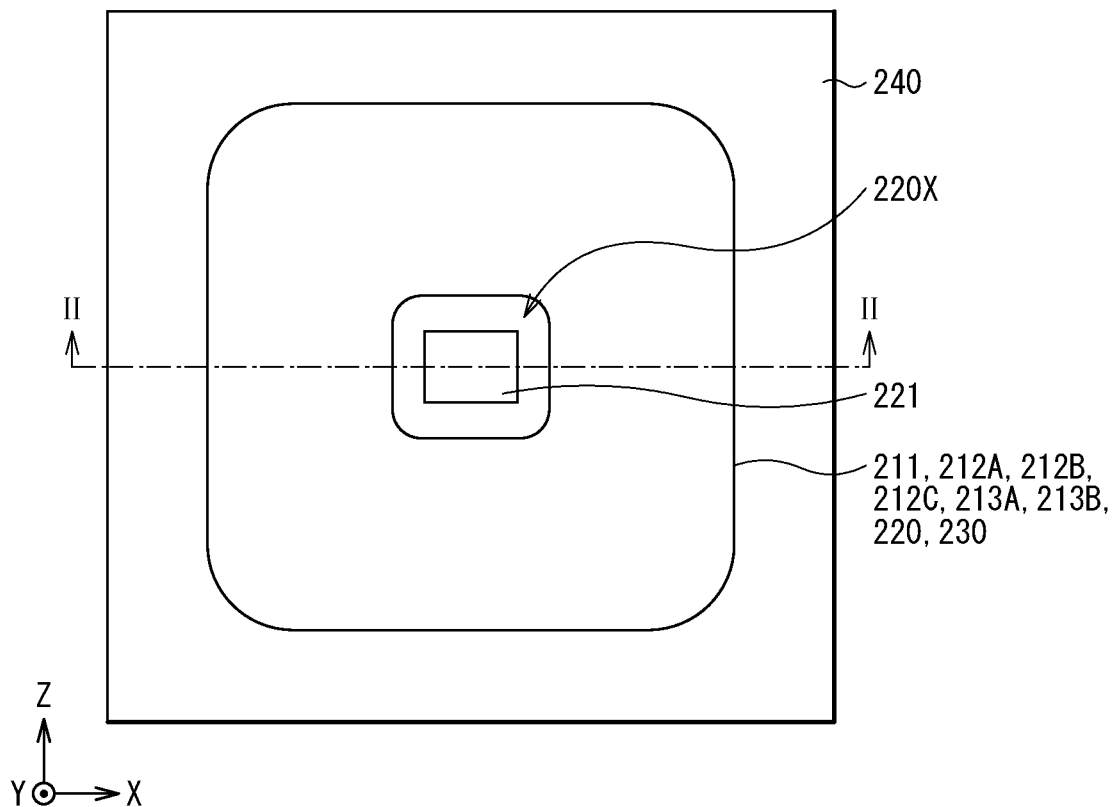
FIG. 15B is a schematic plan diagram illustrating the light-emitting device illustrated in FIG. 15A.

FIG. 15A illustrates an example of a cross-sectional configuration of a light-emitting device 200 (a light-emitting device 200A). FIG. 15B schematically illustrates a plan configuration of the light-emitting device 200A illustrated in FIG. 15A. Note that FIG. 15A illustrates a cross section taken along the II-II line illustrated in FIG. 15B. The light-emitting device 200A is used, for example, as a light source of a projector or an illuminating device such as a headlight source of a vehicle.

The light-emitting device 200A is, for example, a non-rotating transmission type wavelength conversion device. For example, a lens 230 is disposed on a front side of the phosphor layer 211 and LED 221 is disposed on a back side of the phosphor layer 211. In the light-emitting device 200A, excitation light applied from the back side of the phosphor layer 211 is converted into fluorescence in the phosphor layer 211 and is extracted from the lens 230. Specifically, the light-emitting device 200A includes, for example, the LED 221, an introduction lens 220 that forms a hollow structure 220X around the LED 221, a buffer layer 213C, a dielectric film 213B, a reflection preventing film 213A, the phosphor layer 211, a dielectric film 212A, a buffer layer 212B, a dielectric film 212C, and a lens 230 that are stacked in this order in a device case 240. The device case 240 is disposed, for example, on a substrate 250. In the light-emitting device 200A, for example, the phosphor layer 211 and the introduction lens 220, and the phosphor layer 211 and the lens 230 are bonded using the present technology.

Note that, in FIG. 15A, an example is illustrated in which the introduction lens 220 forming the hollow structure 220X around the LED 221 is disposed on the LED 221, although it is not limited thereto. For example, the introduction lens 220 may be omitted and a gap may be formed on the LED 221.

Figure 16A:
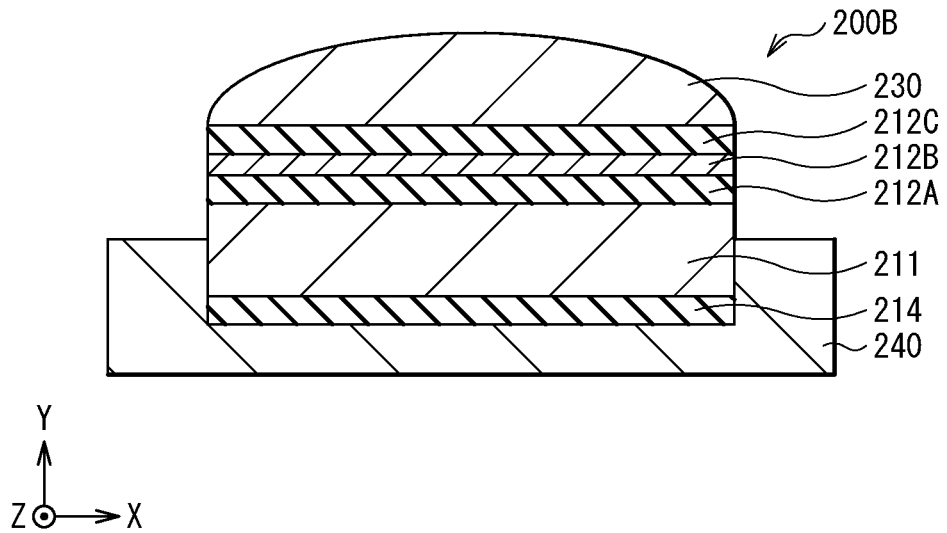
FIG. 16A is a schematic cross-sectional diagram illustrating another example of the light-emitting device according to the Example 2 of the present disclosure.
Figure 16B:
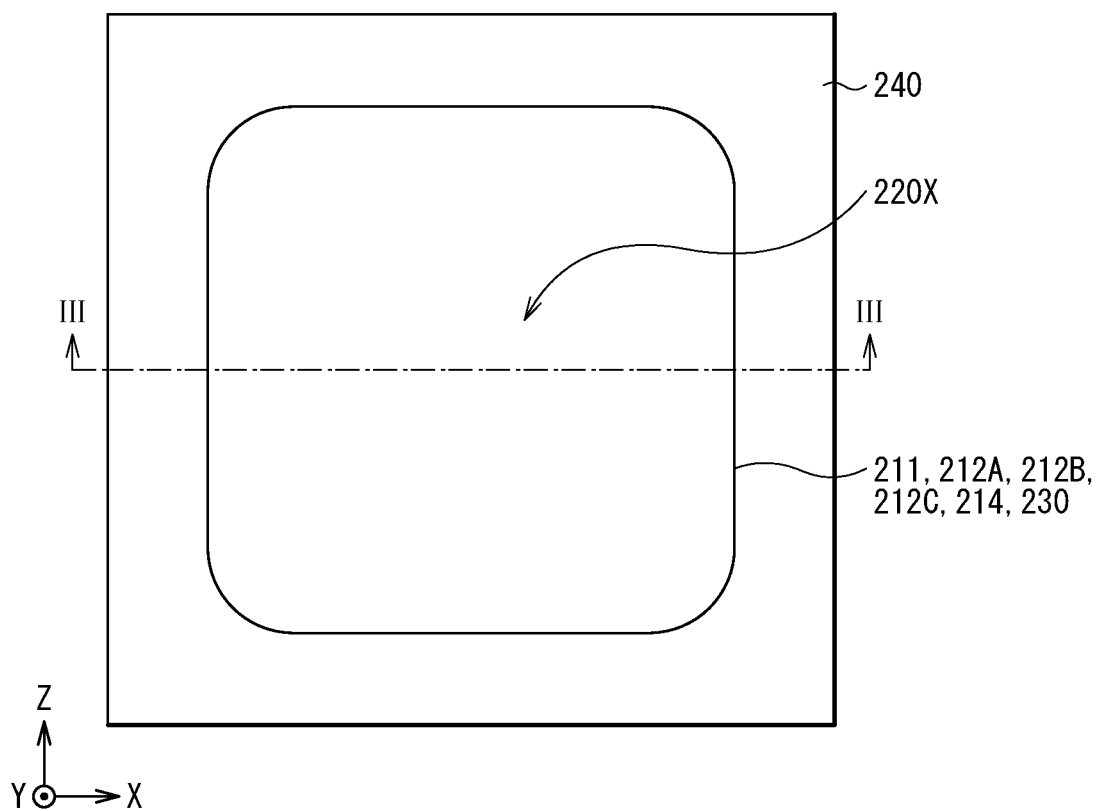
FIG. 16B is a schematic plan diagram illustrating the light-emitting device illustrated in FIG. 16A.

FIG. 16A illustrates an example of a cross-sectional configuration of the light-emitting device 200 (a light-emitting device 200B). FIG. 16B schematically illustrates a plan configuration of the light-emitting device 200B illustrated in FIG. 16A. Note that FIG. 16A illustrates a cross section taken along the line illustrated in FIG. 16B. The light-emitting device 200B is used, for example, as a light source of a projector or an illuminating device such as a headlight source of a vehicle.

The light-emitting device 200B is, for example, a non-rotating reflection type wavelength conversion device. For example, the lens 230 is disposed on the front side of the phosphor layer 211, and a light-emitting device such as LED is disposed outside the light-emitting device 200B. In the light-emitting device 200B, the excitation light enters from the lens 230 side, and the fluorescence converted in the phosphor layer 211 and unconverted excitation light are extracted from the lens 230. Specifically, in the light-emitting device 200B, for example, a reflection mirror 214 configured by, for example, a metal film, the phosphor layer 211, the dielectric film 212A, the buffer layer 212B, the dielectric film 212C, and the lens 230 are stacked in this order in the device case 240. In the light-emitting device 200B, for example, the phosphor layer 211 and the lens 230 are bonded using the present technology.

In general, an YAG ceramic phosphor has a higher refractive index. Accordingly, a fluorescence generated in the ceramic phosphor is confined inside the phosphor by internal reflection. Hence, there is light which is not extractable to the outside.

Micron-sized phosphor particles that are close to spherical reduce an influence of a surface reflection to efficiently introduce light into the interior, and also facilitate light extraction. Further, it is possible to allow the reflected light to be utilized by other phosphor particles. For this reason, in typical white LED, phosphor particles have a shape close to a spherical shape, and the phosphor layer 211 formed by mixing, for example, a sealing resin that includes silicon and phosphor particles is filled in a package. The packaged phosphor layer 211 has a smooth surface, so that an influence of reflection is large, that the confinement of fluorescence is large, and that the light extraction efficiency is low, as with the YAG ceramic phosphor described above.

In contrast, in the light-emitting device 200A and the light-emitting device 200B, the lens 230 is bonded on the phosphor layer 211 via the dielectric film 212A, the buffer layer 212B, and the dielectric film 212C. Thus, it is possible to provide the light-emitting device 200A and the light-emitting device 200B that do not involve total reflection and have improved light extraction efficiency.

Example 3

It is known that a laser amplifier (continuous wave: CW) generally involves an increase in a temperature of a wavelength conversion device (a laser medium) due to an increase in pumping light and involves a decrease in a conversion efficiency. As a solution to this, a material having good thermal conductivity is bonded for a purpose of cooling a waste heat to allow for improvement of heat dissipation characteristics and to allow the conversion efficiency to be maintained by the decrease in the temperature of the laser medium. For example, bonding of combinations of a laser medium YAG (nd: 1.81) and a CVD diamond (nd: 2.39), YAG (nd: 1.81) and 6H-SiC (nd: 2.6), YAG (nd: 1.81) and sapphire (nd: 1.74), YAG (nd: 1.81) and YAG (nd: 1.81), and the like can be considered as a material having a good thermal conductivity. At this time, there is an Fresnel reflection loss at bonding interface in a case of bonding with different materials at a light beam transmission surface. In order to reduce the Fresnel reflection loss at the bonding interface, the bonding containing a dielectric multilayer film and matching refractive indices is effective in terms of a low loss.

Figure 17:
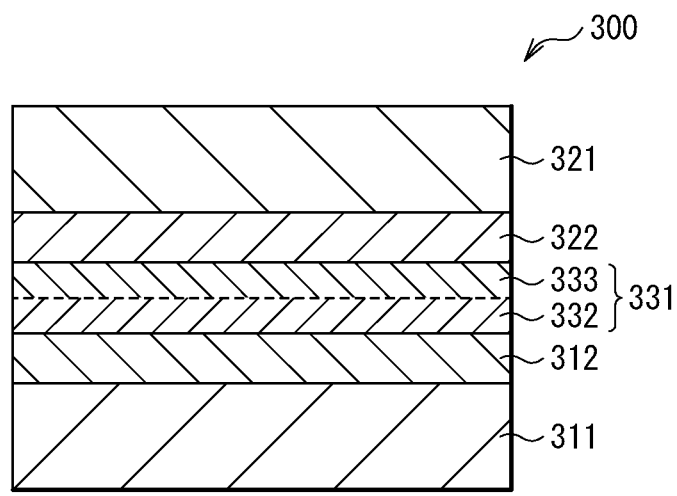
FIG. 17 is a schematic cross-sectional diagram illustrating an example of a configuration of a laser amplifier according to Example 3 of the present disclosure.

FIG. 17 illustrates an example of a cross-sectional configuration of a laser amplifier (a laser amplifier 300) having an exhaust heat structure in which, for example, an YAG layer 311 having a refractive index of 1.81 and an YAG layer 321 are bonded to each other. Its bonding surfaces are respectively provided with interface reflection preventing films 312 and 322 that prevent reflections at interfaces between $SiO_2$ layers 332 and 333, an $SiO_2$ layer 331 and the YAG layer 311, and the $SiO_2$ layer 331 and the YAG layer 321. The YAG layer 311 and the YAG layer 321 correspond to one concrete example of the porous bases 11 and 41 in the modification examples described above, and the $SiO_2$ layers 332 and 333 correspond to the foundation layers and serve as a buffer layer 331. Further, the interface reflection preventing films 312 and 322 correspond to one concrete example of a functional layer. Note that, for example, titanium (Ti) is used as a bonding metal, which is distributed in the vicinity of an interface between the $SiO_2$ layer 332 and the $SiO_2$ 333 of the $SiO_2$ layer 331 structuring the buffer layer, for example.

Example 4

In a pulse laser module, for example, an Nd doped YAG having a function of an amplifier and a Cr doped YAG having a function of a passive Q-switch are bonded. In this case, it is possible to achieve a simple pulse laser device structure in which a wavelength conversion layer (an amplifier) and a passive Q-switch that generates pulsed light are integrated by incorporating and bonding a dielectric multilayer film that reflects a pumping light wavelength and transmits only induced emission light.

Figure 18:
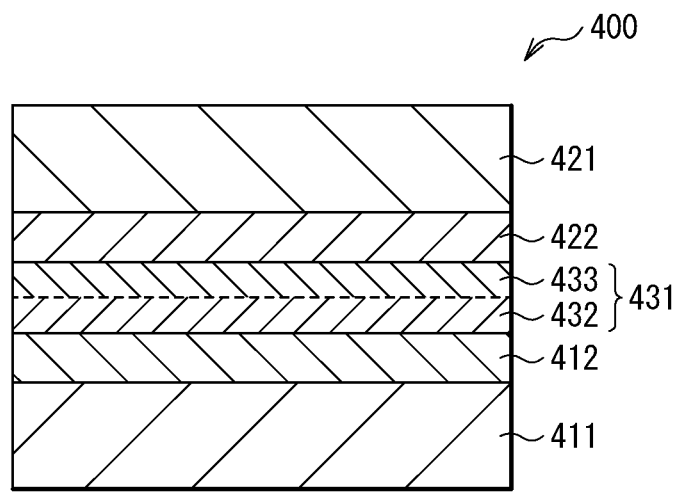
FIG. 18 is a schematic cross-sectional diagram illustrating an example of a configuration of a pulse laser device according to Example 4 of the present disclosure.

FIG. 18 illustrates an example of a cross-sectional configuration of a pulse laser device (a pulse laser device 400) in which a laser amplifier 411 and a Q-switch 421 are bonded. Bonding surfaces of the laser amplifier 411 and the Q-switch 421 are respectively provided with $SiO_2$ layers 432 and 433. An edge filter 412 that reflects the pumping light and transmits the induced emission light is provided between the SiO₂ layer 431 and the laser amplifier 411. An interface reflection preventing film 422 is provided between the SiO₂ layer 331 and the Q-switch 421. In the pulse laser device 400, the laser amplifier 411 and the Q-switch 421 correspond to one concrete example of the porous bases 11 and 41 in the modification examples described above, and the SiO₂ layers 432 and 433 correspond to the foundation layers and serve as a buffer layer 431. Further, the edge filter 412 and the interface reflection preventing film 422 correspond to one concrete example of a functional layer. Note that, for example, titanium (Ti) is used as a bonding metal, which is distributed in the vicinity of an interface between the SiO₂ layer 432 and the SiO₂ 433 of the SiO₂ layer 331 structuring the buffer layer, for example.

While the present disclosure has been described above with reference to the first and the second embodiments, the modification examples 1 and 2, and the Examples, the present disclosure is not limited to the embodiments described in the above embodiments, etc., and various modifications can be made. For example, it is not necessary to include all of the components described in the embodiments, etc., and may further include other components. Moreover, the materials and thicknesses of the components described above are merely examples and the materials and thicknesses are not limited to those described.

In addition, for example, in the first embodiment, etc., although the porous base material has been described as the porous base 11, the present technology is not limited to the porous base material. It is possible to apply the present technology to bonding of a metal having low workability, a difficult-to-process glass material, and the like.

It is to be noted that the effects described in the present specification are merely examples, but not limited. Moreover, other effects may be included.

It is also possible to configure the present disclosure as follows. According to the configurations described below, the buffer layer containing at least a metal element that is superior in processability is provided between a first base and a second base. The first base has one surface, and has a density lower than a density that is determined by a crystal structure and a composition of a constituent material. The second base is disposed to face the one surface of the first base. Hence, as a bonding surface with the second base, it is possible to form a bonding surface having a small arithmetic average roughness (Ra) on the one surface of the first base. Therefore, it is possible to provide a structure body having improved a bonding strength and an electronic apparatus including the same.

(1)
A structure body including:
a first base having one surface, and having a density lower than a density that is determined by a crystal structure and a composition of a constituent material;
a second base disposed to face the one surface of the first base; and
a buffer layer provided between the first base and the second base, and containing at least a metal element.

(2)
The structure body according to (1), in which the first base has a region having a large surface roughness in at least a portion of the one surface.

(3)
The structure body according to (1) or (2), in which the first base has an arithmetic average roughness (Ra) of 2 nm or greater.

(4)
The structure body according to any one of (1) to (3), in which the first base includes a porous base material.

(5)
The structure body according to any one of (1) to (4), in which the first base includes ceramics.

(6)
The structure body according to any one of (1) to (3), in which the second base includes a metal base material.

(7)
The structure body according to any one of (1) to (3), in which the first base includes a difficult-to-process glass material.

(8)
The structure body according to any one of (1) to (7), in which the metal element is locally distributed in the buffer layer in a film-thickness direction.

(9)
The structure body according to any one of (1) to (8), in which the buffer layer has a light permeability.

(10)
The structure body according to any one of (1) to (9), further including a functional layer provided at least one of between the first base and the buffer layer or between the second base and the buffer layer.

(11)
The structure body according to any one of (1) to (10), in which the first base and the second base are bonded by an atomic diffusion bonding.

(12)
A structure body manufacturing method including:
bonding a first base and a second base, the first base having one surface, and having a density lower than a density that is determined by a crystal structure and a composition of a constituent material; and
forming, between the first base and the second base, a buffer layer containing at least a metal element.

(13)
The structure body manufacturing method according to (12), further including:
forming, on the first base, a first buffer layer containing at least the metal element;
polishing a surface of the first buffer layer; and
forming, on the first buffer layer, a first metal film having a microcrystal structure after the polishing, in which the bonding includes bonding the first metal film and the second base.

(14)
The structure body manufacturing method according to (13), further including, after the bonding the first metal film and the second base, performing a heating treatment to form the buffer layer.

(15)
The structure body manufacturing method according to any one of (12) to (14), further including:
forming, on the first base, a first buffer layer containing at least the metal element;
polishing a surface of the first buffer layer;
forming, on the first buffer layer, a first metal film having a microcrystal structure after the polishing; and
forming, on the second base, a second buffer layer containing at least the metal element and a second metal film having a microcrystal structure, in which the bonding includes bonding the first metal film and the second metal film.

(16)

The structure body manufacturing method according to (15), further including, after the bonding the first metal film and the second metal film, performing a heating treatment to form the buffer layer.

(17)

The structure body manufacturing method according to any one of (13) to (16), in which the first buffer layer is formed using a vacuum deposition method or a sputtering method.

(18)

The structure body manufacturing method according to any one of (13) to (17), in which the surface of the first buffer layer is processed by an optical polishing or a chemical mechanical polishing.

(19)

An electronic apparatus with a structure body, the structure body including:
- a first base having one surface, and having a density lower than a density that is determined by a crystal structure and a composition of a constituent material;
- a second base disposed to face the one surface of the first base; and
- a buffer layer provided between the first base and the second base, and containing at least a metal element.

The present application claims the benefit of Japanese Priority Patent Application JP2019-000662 filed with the Japan Patent Office on Jan. 7, 2019, the entire contents of which are incorporated herein by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A structure body, comprising:
a first base having one surface, and having a density lower than a density that is determined by a crystal structure and a composition of a constituent material;
a second base disposed to face the one surface of the first base; and
a buffer layer provided between the first base and the second base, and containing at least a metal element, wherein the first base comprises a glass material, and wherein at least the one surface of the first base has an average roughness of greater than 1.0 nm.

2. The structure body according to claim 1, wherein the metal element is locally distributed in the buffer layer in a film-thickness direction.

3. The structure body according to claim 1, further comprising a functional layer provided at least one of between the first base and the buffer layer or between the second base and the buffer layer.

4. The structure body according to claim 1, wherein the glass material has a degree of abrasion of 300 or more.

5. The structure body according to claim 1, wherein the glass material is a phosphoric-acid-based glass material, a fluorophosphate-based glass material, or a glass material containing lead oxide as a main component.

6. The structure body according to claim 1, wherein the first base and the second base are bonded by an atomic diffusion bonding.

7. The structure body according to claim 1, wherein the buffer layer has a light permeability.

8. A structure body, comprising:
a first base having one surface, and having a density lower than a density that is determined by a crystal structure and a composition of a constituent material;
a second base disposed to face the one surface of the first base; and
a buffer layer provided between the first base and the second base, and containing at least a metal element, wherein the buffer layer has a light permeability.

9. The structure body according to claim 8, wherein the first base has a region having a large surface roughness of greater than 1.0 nm in at least a portion of the one surface.

10. The structure body according to claim 8, wherein the first base has an arithmetic average roughness (Ra) of 2 nm or greater.

11. The structure body according to claim 8, wherein the first base comprises a porous base material.

12. The structure body according to claim 8, wherein the first base comprises ceramics.

13. The structure body according to claim 8, wherein the second base comprises a metal base material.

14. A structure body, comprising:
a first base having one surface, and having a density lower than a density that is determined by a crystal structure and a composition of a constituent material;
a second base disposed to face the one surface of the first base; and
a buffer layer provided between the first base and the second base, and containing at least a metal element, wherein the first base and the second base are bonded by an atomic diffusion bonding.

15. The structure body according to claim 14, wherein the first base has a region having a large surface roughness in at least a portion of the one surface.

16. The structure body according to claim 14, wherein the first base has an arithmetic average roughness (Ra) of 2 nm or greater.

17. The structure body according to claim 14, wherein the first base comprises a porous base material.

18. The structure body according to claim 14, wherein the first base comprises ceramics.

19. The structure body according to claim 14, wherein the second base comprises a metal base material.

20. The structure body according to claim 14, wherein the buffer layer has a light permeability.

* * * * *